United States Patent
O'Neill et al.

(10) Patent No.: US 11,911,791 B2
(45) Date of Patent: Feb. 27, 2024

(54) DEVICE WITH LIGHT CONTROL STRUCTURE HAVING MAGNETIZABLE PARTICLES

(71) Applicant: 3M INNOVATIVE PROPERTIES COMPANY, St. Paul, MN (US)

(72) Inventors: Mark B. O'Neill, Stillwater, MN (US); Gary E. Gaides, Woodbury, MN (US); Joseph B. Eckel, Vadnais Heights, MN (US); Aaron K. Nienaber, Lake Elmo, MN (US); Ronald D. Jesme, Plymouth, MN (US); Mark D. Weigel, Hugo, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 17/257,878

(22) PCT Filed: Jul. 18, 2019

(86) PCT No.: PCT/US2019/042411
§ 371 (c)(1),
(2) Date: Jan. 5, 2021

(87) PCT Pub. No.: WO2020/018794
PCT Pub. Date: Jan. 23, 2020

(65) Prior Publication Data
US 2021/0273126 A1     Sep. 2, 2021

Related U.S. Application Data

(60) Provisional application No. 62/699,966, filed on Jul. 18, 2018.

(51) Int. Cl.
*G02B 5/00* (2006.01)
*H01L 31/054* (2014.01)
(Continued)

(52) U.S. Cl.
CPC .............. *B05D 3/203* (2013.01); *B05D 5/061* (2013.01); *G02B 5/003* (2013.01); *B05D 3/067* (2013.01);
(Continued)

(58) Field of Classification Search
CPC .............. H01L 31/054; H01L 31/0549; H01L 31/0488; H01L 31/02; B05D 3/203;
(Continued)

(56) References Cited

U.S. PATENT DOCUMENTS 2,370,636 A    3/1945 Carlton
2,857,879 A    10/1958 Johnson
(Continued)

FOREIGN PATENT DOCUMENTS

GB    1477767    6/1977
JP    S61235804 A    10/1986
(Continued)

OTHER PUBLICATIONS

International Search Report for PCT International Application No. PCT/US2019/042411, dated Jan. 8, 2020, 5 pages.

*Primary Examiner* — Marin Pichler
(74) *Attorney, Agent, or Firm* — Robert S. Moshrefzadeh

(57) ABSTRACT

According to one embodiment, a solar device, comprises one or more photovoltaic cells disposed in an encapsulant and a light control structure including a louver film having a series of louver structures, wherein each louver structure includes one or more groupings of a plurality magnetizable particles aligned at least in a first orientation dispersed in a binding matrix. The light control structure substantially transmits light incident at a first angle and substantially limits transmission of light incident at a second angle. Each louver structure is spaced apart from an adjacent louver structure, wherein each louver structure is substantially (Continued)

aligned in a plane substantially parallel to an adjacent louver structure.

4 Claims, 22 Drawing Sheets

(51) Int. Cl.
  *B05D 3/00* (2006.01)
  *B05D 5/06* (2006.01)
  *B05D 3/06* (2006.01)
(52) U.S. Cl.
  CPC .............. *B05D 3/20* (2013.01); *B05D 5/06* (2013.01); *G02B 2207/123* (2013.01)
(58) Field of Classification Search
  CPC .......... B05D 5/061; B05D 3/067; B05D 3/20; B05D 5/06; G02B 5/001; G02B 5/003; G02B 5/3058; G02B 5/3083; G02B 5/1857; G02B 2207/123; H02S 20/25; Y02E 10/52
  See application file for complete search history.

(56) References Cited

U.S. PATENT DOCUMENTS

| | | | |
|---|---|---|---|
| 3,625,666 A | 12/1971 | James | |
| 4,008,055 A | 2/1977 | Phaal | |
| 4,612,242 A | 9/1986 | Vesley et al. | |
| 5,104,210 A | 4/1992 | Tokas | |
| 5,147,716 A | 9/1992 | Bellus | |
| 5,181,939 A | 1/1993 | Neff | |
| 5,943,156 A | 8/1999 | Komuro et al. | |
| 7,727,931 B2 | 6/2010 | Brey et al. | |
| 8,213,082 B2 | 7/2012 | Gaides et al. | |
| 2004/0036993 A1 | 2/2004 | Tin | |
| 2008/0289262 A1 | 11/2008 | Gao | |
| 2011/0075258 A1 | 3/2011 | Mullen | |
| 2017/0003424 A1 | 1/2017 | Rahman et al. | |

FOREIGN PATENT DOCUMENTS

| | | | |
|---|---|---|---|
| JP | H08-051231 A | | 2/1996 |
| JP | 2005257782 A | * | 9/2005 |
| WO | WO 2009-143459 | | 11/2009 |
| WO | WO 2018-078493 | | 5/2018 |
| WO | WO 2018-080703 | | 5/2018 |
| WO | WO 2018-080704 | | 5/2018 |
| WO | WO 2018-080705 | | 5/2018 |
| WO | WO 2018-080755 | | 5/2018 |
| WO | WO 2018-080756 | | 5/2018 |
| WO | WO 2018-080765 | | 5/2018 |
| WO | WO 2018-080784 | | 5/2018 |
| WO | WO 2018-080799 | | 5/2018 |
| WO | WO 2018-134732 | | 7/2018 |
| WO | WO 2018-136268 | | 7/2018 |
| WO | WO 2018-136269 | | 7/2018 |
| WO | WO 2018-136271 | | 7/2018 |
| WO | WO 2018-229600 | | 12/2018 |
| WO | WO 2020-018771 | | 1/2020 |

* cited by examiner

Example 13

Example 14

Example 15

DEVICE WITH LIGHT CONTROL STRUCTURE HAVING MAGNETIZABLE PARTICLES

TECHNICAL FIELD

This document pertains generally, but not by way of limitation, to devices, such as solar cells and solar roof panels, having light control structures, such as films, that include magnetizable particles.

BACKGROUND

Light control films (LCF) are optical films configured to regulate the transmission of light. Typical LCFs include a light transmissive film having a plurality of parallel grooves, which are formed of a light-absorbing material.

LCFs known in the art control visible light and are used in conjunction with the control of light available to displays. For example, LCFs can be placed proximate a display surface, image surface, or other surface to be viewed. At normal incidence, (i.e. 0° viewing angle) where a viewer is looking at an image through the LCF in a direction that is perpendicular to the film surface, the image is viewable. As the viewing angle increases, the amount of light transmitted through the LCF decreases until an external viewing cutoff angle is reached where substantially all (greater than about 95%) the light is blocked by the light-absorbing material and the image is no longer viewable. The LCF provides privacy to a viewer by blocking observation by others that are outside a typical range of viewing angles.

Traditionally, LCFs can be prepared by molding and ultraviolet curing a polymerizable resin on a polycarbonate substrate. Such LCFs are commercially available from 3M Company, St. Paul, Minn., under the trade designation "3M™ Privacy Filters for Notebook Computers and LCD Monitors." These forming processes can be intensive and costly.

SUMMARY

The present disclosure relates to devices that include light control structures having magnetizable particles that can be used as part of LCFs. These devices can include a variety of devices, such as solar cells and solar roof panels. The magnetizable particles can be positioned, aligned and/or oriented relative to one another within a resin using a magnetic field to form a desired structure(s) for light control.

Considering the processing and costs associated with traditional LCFs, the present inventors have recognized, among other things, that LCFs can benefit from the use of magnetizable particles which can be arranged into the desired structure at lower cost. As such, the present inventors have developed processes and apparatuses that vary the magnetic field to control the magnetizable particles orientation, position, and/or alignment relative to one another to form the desired structure. The present inventors have discovered that an applied magnetic field when varied, for example by rotating modulation relative to the magnetizable particles, or by an applied changing magnetic field that changes angles multiple times, can be used to achieve the desired structure for the plurality of magnetizable particles in the resin or binding matrix. Once such desired structure for the plurality of magnetizable particles within the resin or binding matrix has been achieved, a viscosity of the resin or binding matrix can be increased such as by partially curing or fully curing the resin or binding matrix. Varying of the magnetic field can be accomplished by multiple processes some of which are described in the embodiments that follow. The processes can achieve the desired structure for the plurality of magnetizable particles.

For certain devices, including large scale devices, such as solar cells or solar roof panels, the resulting structure for the plurality of magnetizable particles can be implemented as a light control film (LCF) that can be used to hide or camouflage the solar cell/solar roof panel when viewing from certain angles, while still allowing substantial transmission of sunlight to provide efficient conversion of sunlight to electrical energy.

According to one exemplary embodiment, a solar device, comprises one or more photovoltaic cells disposed in an encapsulant and a light control structure including a louver film having a series of louver structures, wherein each louver structure includes one or more groupings of a plurality magnetizable particles aligned at least in a first orientation dispersed in a binding matrix. The light control structure substantially transmits light incident at a first angle and substantially limits transmission of light incident at a second angle. Each louver structure is spaced apart from an adjacent louver structure, wherein each louver structure is substantially aligned in a plane substantially parallel to an adjacent louver structure.

According to another embodiment, each louver structure is oriented at a louver angle from about 0° to about 50° from a normal to a light incident surface of the light control structure.

According to another embodiment, the plurality of magnetizable particles includes a plurality of groupings of magnetizable particles, wherein each grouping of particles is spaced apart from an adjacent grouping by from about 0.05 mm to about 5 mm.

According to another embodiment, a light control film comprises a series of louver structures, wherein each louver structure includes a one or more groupings of a plurality magnetizable particles aligned at least in a first orientation dispersed in a binding matrix. The light control film substantially transmits light incident at a first angle and substantially limits transmission of light incident at a second angle. Each louver structure is spaced apart from an adjacent louver structure, wherein each louver structure is aligned in a plane substantially parallel to an adjacent louver structure.

According to another embodiment, light incident on a light input surface exits a light output surface having a maximum relative brightness ratio (RBR) in the major viewing axis direction of 50% or greater and an effective polar viewing angle (EPVA) of 150° or less.

According to another embodiment, a solar device comprises one or more photovoltaic cells disposed in an encapsulant and first and second light control films. The first light control film is oriented with respect to the second light control film such that the substantially parallel louver structures for the first light control film are skewed at an angle between 10° to 90° relative to the substantially parallel louver structures for the second light control film.

According to another embodiment, a light control film consists of a plurality of magnetizable particles ordered and aligned within a binding matrix to form a louver film having alternating light transmissive regions and light blocking regions, wherein the light blocking regions are aligned at a louver angle from about 0° to about 40°.

According to another embodiment, a light control film comprises louver structures having non-zero louver angles with respect to a normal to a light incident surface, wherein the EPVA is asymmetric about the incidence angle of maximum relative brightness ratio.

According to another embodiment, a light control film comprises louver structures having non-zero louver angles with respect to a normal to a light incident surface, wherein the incidence angle of RBR on a first side of a normal to the light incident surface is greater than 70° and less than 70° on a second side.

As used herein:

The term "a", "an", and "the" are used interchangeably with "at least one" to mean one or more of the elements being described.

The term "and/or" means either or both. For example, "A and/or B" means only A, only B, or both A and B.

The terms "including," "comprising," or "having," and variations thereof, are meant to encompass the items listed thereafter and equivalents thereof as well as additional items.

Unless specified or limited otherwise, the term "coupled", "positioned" or "deposited" and variations thereof are used broadly and encompass both direct and indirect coupling, positioning, depositing, etc.

The term "adjacent" refers to the relative position of two elements, such as, for example, two layers, that are close to each other and may or may not be necessarily in contact with each other or that may have one or more layers separating the two elements as understood by the context in which "adjacent" appears.

The term "immediately adjacent" refers to the relative position of two elements, such as, for example, two layers, that are next to each other and in contact with each other and have no intermediate layers separating the two elements. The term "immediately adjacent," however, encompasses situations where one or both elements (e.g., layers) have been treated with a primer, or whose surface has been modified to affect the properties thereof, such as etching, embossing, etc., or by surface treatments, such as corona or plasma treatment, etc. that may improve adhesion.

The term "optically clear" as used herein refers to an item (e.g., a film) in a given region of the electromagnetic spectrum (e.g., visible, infrared, radio, or any other range) that has a luminous transmittance of higher than 20% and that exhibits a haze value lower than 40%. Both the luminous transmission and the total haze can be determined using, for example, a BYK Gardner Haze-gard Plus (Catalog No. 4725) according to the method of ASTM-D 1003-13, Procedure A (Hazemeter).

The term "film" as used herein refers, depending on the context, to either a single layer article or to a multilayer construction, where the different layers have been processed according to the techniques described herein.

The term "transmittance" as used herein refers to the percentage of energy in a given region of the electromagnetic spectrum (e.g., visible, infrared, or any other range) that is transmitted across a surface. Transmittance is measured in accordance with the method described in ASTM 1348-15.

The phrase "major surface" or variations thereof, are used to describe an article such as a web having a thickness that is small relative to its length and width. The length and width of such articles can define the "major surface" of the article, but this major surface, as well as the article, need not be flat or planar. For example, the above phrases can be used to describe an article having a first ratio ($R_1$) of thickness (e.g., in a Z direction that is orthogonal to a major surface of the article at any point along the major surface) to a first surface dimension of the major surface (e.g., width or length), and a second ratio ($R_2$) of thickness to a second surface dimension of the major surface, where the first ratio ($R_1$) and the second ratio ($R_2$) are both less than 0.1. In some embodiments, the first ratio ($R_1$) and the second ratio ($R_2$) can be less than 0.01; in some embodiments, less than 0.001; and in some embodiments, less than 0.0001. Note that the two surface dimensions need not be the same, and the first ratio ($R_1$) and the second ratio ($R_2$) need not be the same, in order for both the first ratio ($R_1$) and the second ratio ($R_2$) to fall within the desired range. In addition, none of the first surface dimension, the second surface dimension, the thickness, the first ratio ($R_1$), and the second ratio ($R_2$) need to be constant in order for both the first ratio ($R_1$) and the second ratio ($R_2$) to fall within the desired range.

The term "light" includes one or more forms of light, alone or in combination, including, but not limited to, visible light, ultraviolet light and infrared light and radio frequency electromagnetic waves.

The terms "control of light", "light control" or the like means an optical film that is configured to regulate transmission of light through the optical film. In some embodiments, the transmission of light will be through the optical film to a substrate.

The term "relative brightness ratio" (or RBR) refers to the ratio of the luminance profile of a diffuse light source in the presence of a light control film to the luminance profile of the same source without the light control film.

The term "incidence angle of maximum RBR" as used herein in the context of a film having mostly parallel louvers or louver structures refers to the incidence angle in the plane perpendicular to the length of the louvers or louver structures on the LCF for which RBR is at its maximum value in a given region of the electromagnetic spectrum measured. For instance, with respect to FIG. 2B, the 30° angle is measured in the plane perpendicular to the length of the louvers and coincident with the plane of the page.

The term "effective polar viewing angle" (EPVA) refers to the range of incidence angles where the relative brightness ratio is 10% or more. The viewing angle will not be symmetric about the surface normal for louver structures with non-zero $\Theta_{louver}$.

The term "ferrimagnetic" refers to materials that exhibit ferrimagnetism. Ferrimagnetism is a type of permanent magnetism that occurs in solids in which the magnetic fields associated with individual atoms spontaneously align themselves, some parallel, or in the same direction (as in ferromagnetism), and others generally antiparallel, or paired off in opposite directions (as in antiferromagnetism). The magnetic behavior of single crystals of ferrimagnetic materials can be attributed to the parallel alignment; the diluting effect of those atoms in the antiparallel arrangement keeps the magnetic strength of these materials generally less than that of purely ferromagnetic solids such as metallic iron. Ferrimagnetism occurs chiefly in magnetic oxides known as ferrites. The spontaneous alignment that produces ferrimagnetism is entirely disrupted above a temperature called the Curie point, characteristic of each ferrimagnetic material. When the temperature of the material is brought below the Curie point, ferrimagnetism revives.

The term "magnet" can include a ferromagnetic material that responds to a magnetic field and acts as a magnet. "Magnet" can be any material that exerts a magnetic field in either a permanent, semi-permanent, or temporary state. The term "magnet" can be one individual magnet or an assembly of magnets that would act like a single magnet. The term "magnet" can include permanent magnets and electromagnets.

The term "ferromagnetic" refers to materials that exhibit ferromagnetism. Ferromagnetism is a physical phenomenon in which certain electrically uncharged materials strongly attract others. In contrast to other substances, ferromagnetic materials are magnetized easily, and in strong magnetic fields the magnetization approaches a definite limit called saturation. When a field is applied and then removed, the magnetization does not return to its original value. This phenomenon is referred to as hysteresis. When heated to a certain temperature called the Curie point, which is generally different for each substance, ferromagnetic materials lose their characteristic properties and cease to be magnetic; however, they become ferromagnetic again on cooling.

The terms "magnetic" and "magnetized" mean being ferromagnetic or ferrimagnetic at 20° C., unless otherwise specified.

The term "magnetizable" means that the item being referred to is magnetic or can be made magnetic using an applied magnetic field and has a magnetic moment of at least 0.001 electromagnetic units (emu), in some cases at least 0.005 emu, and yet other cases 0.01 emu, and yet other cases up to and including 0.1 emu, although this is not a requirement.

The term "magnetic field" refers to magnetic fields that are not generated by any astronomical body or bodies (e.g., Earth or the sun). In general, magnetic fields used in practice of the present disclosure have a field strength in the region of the magnetizable particles being oriented of at least about 10 gauss (1 mT), in some cases at least about 100 gauss (10 mT), and in yet other cases at least about 1000 gauss (0.1 T), and in yet other cases at least about 10,000 gauss (1.0 T).

The term "rotation" refers to angular displacement that is a portion of or an entire revolution or several revolutions.

The term "length" refers to the longest dimension of an object.

The term "width" refers to the longest dimension of an object that is perpendicular to its length.

The term "thickness" refers to the longest dimension of an object that is perpendicular to both of its length and width.

The term "aspect ratio" refers to the ratio length/thickness of an object.

The term "orientation", "orient" "orienting" or "oriented" as it refers to the magnetizable particles provided by the magnetic field(s) of the present disclosure can refer to a non-random disposition of at least a majority of the particles relative to the substrate (sometimes referred to as a backing herein). For example, a majority of the magnetizable particles have a major planar surface disposed at an angle of at least 70 degrees relative to the first major surface of the substrate after application of the magnetic field. These terms can also refer to major axes and dimensions of the magnetizable particles themselves. For example, the particle maximum length, width and thickness are a function of a shape of the magnetizable particle, and the shape may or may not be uniform. The present disclosure is in no way limited to any particular particle shape, dimensions, type, etc., and many exemplary magnetizable particles useful with the present disclosure are described in greater detail below. However, with some shapes, the "length", "width" and "thickness" give rise to major faces and minor side faces. Regardless of an exact shape, any magnetizable particle can have a centroid at which particle local Cartesian axes u (length), v (width), and w (thickness) can be defined. The orientation effected by the magnetic field(s) of the present disclosure can entail application of the magnetic field to alter or otherwise change a spatial arrangement of at least a majority of the plurality of the magnetizable particles relative to the substrate and/or on a particle level. The change or alteration can be to a desired range of rotational orientations about the particle in one or more of the z-axis, the y-axis and/or the x-axis and/or to a range of rotational orientations about the particle axes.

The term "position", "positioning", "position" or "position" as it refers to magnetizable particles provided by the magnetic field(s) of the present disclosure can refer to a non-random disposition of at least a majority of the particles relative to one another. For example, a majority of the magnetizable particles may be spaced a desired distance apart in at least one axis after application of the magnetic field.

The term "alignment" "aligning" "aligned" or "align" as it refers to the magnetizable particles provided by the magnetic field(s) of the present disclosure can refer to a non-random positioning of at least a majority of the magnetizable particles. Specifically, having "alignment" can position a majority of the magnetizable particles such that a majority of the magnetizable particles have major surfaces that are substantially parallel with one another substantially perpendicular to one another, and/or are oriented at a desired angle with respect to one another.

The term "desired structure" means a structure formed from a plurality of magnetizable particles where at least a majority of the plurality of particles have one or more of an orientation, position, and/or alignment relative to one another and/or the substrate that has been affected by application of the magnetic field(s).

The term "vitrification" "vitrified" "vitrifying" or "vitrify" as it refers to the resin mixture containing the magnetizable particles means increasing the viscosity of the resin mixture so as to enable at least a majority of the magnetizable particles to maintain their desired structure after removal from the magnetic field(s). Vitrification may be only partially accomplished to a sufficient amount so as to enable at least a majority of the magnetizable particles to maintain their desired structure after removal from the magnetic field(s). Vitrification may occur via polymerization (e.g. radiation curable or thermally curable resin systems), solidification through removal of thermal energy (e.g. solidification of a polymer melt), or evaporation of a solvent from the resin mixture. The terms "Cure", "Cure 1" and "Cure 2" as used in this document are all vitrification processes.

All scientific and technical terms used herein have meanings commonly used in the art unless otherwise specified. The definitions provided herein are to facilitate understanding of certain terms used frequently in this application and are not meant to exclude a reasonable interpretation of those terms in the context of the present disclosure.

Unless otherwise indicated, all numbers in the description and the claims expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviations found in their respective testing measurements.

The term "substantially" means within 20 percent (in some cases within 15 percent, in yet other cases within 10 percent, and in yet other cases within 5 percent) of the attribute being referred to. Thus, a value A is "substantially similar" to a value B if the value A is within plus/minus one or more of 5%, 10%, 20% of the value A.

Features and advantages of the present disclosure will be further understood upon consideration of the detailed description as well as the appended claims.

The recitation of numerical ranges by endpoints includes all numbers subsumed within that range (e.g. a range from 1 to 5 includes, for instance, 1, 1.5, 2, 2.75, 3, 3.80, 4, and 5) and any range within that range.

This overview is intended to provide an overview of subject matter of the present patent application. It is not intended to provide an exclusive or exhaustive explanation of the invention. The detailed description is included to provide further information about the present patent application.

Figure 1:
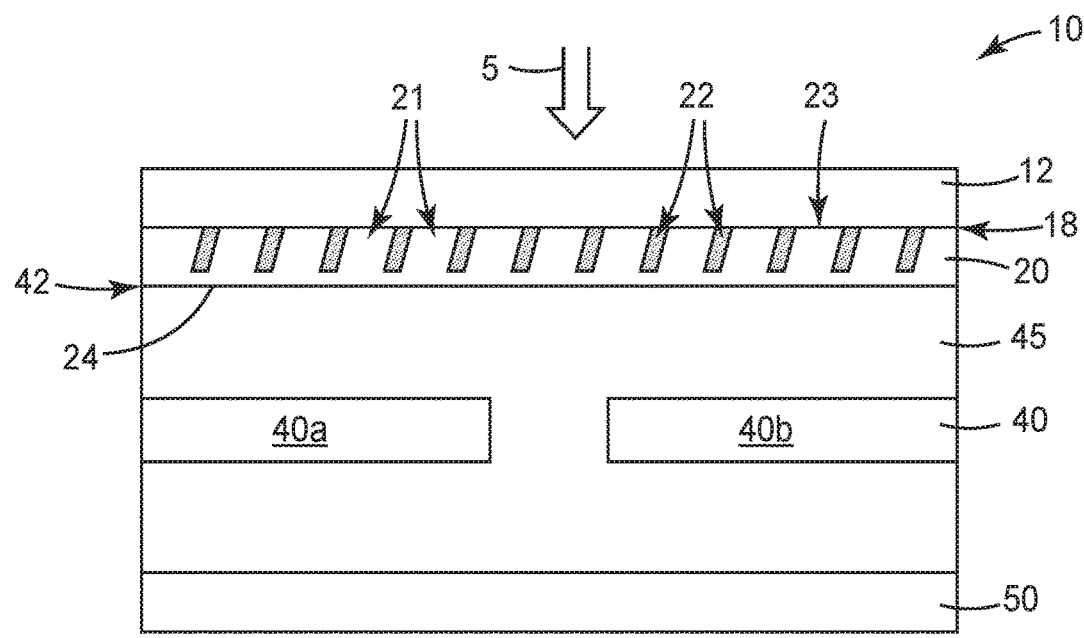
FIG. 1 is a schematic cross section view of a device having a light control structure according to a first embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION

In accordance with various embodiments described herein, devices can include light control structures, such as light control films (LCFs), which can be formed using magnetizable particles dispersed in a binding matrix or resin. The magnetizable particles can be positioned, aligned and/or oriented relative to one another within a binding matrix or matrix resin using a magnetic field to form a desired structure(s) for light control, such as a louver structure. In some aspects, one or more groups of magnetizable particles can form one or more louver structures that can be spaced apart, aligned and/or angled to form a desired structure that controls the angular transmission of a film. These light control structures can be used to camouflage one or more solar cells and/or solar panels on a roof or other structure. The methods described herein can be used to form devices having assembled magnetizable particles of multi-particle lengths and heights.

While the devices and light control structures (e.g., LCFs) described herein are utilized in exemplary solar cell and solar panel applications, one of ordinary skill in the art would understand that such devices and/or LCFs can be utilized in a host of other applications, including privacy films, displays (for computers, cars, etc.), fingerprint sensors, and window films. While LCFs in general are known, LCFs having specifically tailored structures in accordance with the configurations and methods described herein can be designed and manufactured in a much more straightforward and cost effective manner than known LCF fabrication methods, such as is described in WO 2018/078493 and WO 2018/229600.

The LCFs of the present disclosure may be applied to a solar photovoltaic cell ("PV cell"), one or more PV cells, and/or to an entire solar module or panel. A benefit of placing the LCF over a PV cell or module is that the LCF can hide or obscure the cell or module to observers viewing the cell or module from an angle greater than ½ of the external viewing cutoff angle, without significantly reducing incident solar radiation on the photovoltaic surface. A PV cell can be fabricated from silicon, CIGS, Perovskites and the like.

In general, PV cells are relatively small in size and can be combined into a physically integrated solar module(s). PV modules are generally formed from a single cell or a small number of cells in one string or two or more "strings" of PV cells, with each string including two or more PV cells arranged in a row and typically electrically connected in series using tinned flat copper wires (also known as electrical connectors, tabbing ribbons, or bus wires). These electrical connectors are typically adhered to the PV cells by a soldering process.

A functional PV cell typically comprises the actual photovoltaic cell surrounded by an encapsulant, such as, for example, an EVA based or a polyolefin based encapsulant. In typical constructions, the PV cell includes encapsulant on both sides of the photovoltaic surface. A glass panel (or other suitable clear polymeric material) is bonded to each of the front and back sides of the encapsulant. The front panels are transparent to solar radiation and are typically referred to as the front-side layer or front-side cover. Back panels may be transparent, but are not required to be, and are usually referred to as the backside layer or backsheet. The front-side cover and the backsheet may be made of the same or a different material. Typically, the front-side cover is made of glass, but other transparent materials may also be used. The encapsulant is usually a transparent polymer material that encapsulates the PV cells and also is bonded to the front-side layer and the backsheet so as to physically seal off the photovoltaic surfaces. This laminated construction provides mechanical support for the PV cells and also protects them against damage due to environmental factors such as wind, snow, and ice. Typical PV modules are fit into a frame, usually made of metal, and has a sealant covering the edges of the module. The frame not only protects the edges of the module, but also provides additional mechanical strength to the entire assembly. However, not all modules comprise a frame.

In some embodiments, the light control structures of the present disclosure are placed over a single photovoltaic cell or over an entire solar module. The light control structures can be placed at different locations within the solar assembly. For instance, LCFs can be placed adjacent to the photovoltaic surface, embedded within the encapsulant, or adjacent the front-side layer, either next to the encapsulant or on the exterior surface of the front-side layer. In certain preferred embodiments, a light control structure, such as an LCF, is placed adjacent to the front-side layer, between its interior surface and the encapsulant. An adhesive or adhesive layer may be used to bond the LCFs to the desired substrate within the photovoltaic cell or solar module. In some embodiments, the LCFs of the present disclosure are placed external to the module on the front-side layer. The adhesive or adhesive layer may be optically clear, tinted or diffusive.

FIG. 1 shows an embodiment of the present invention, a cross section view of a solar cell device 10. The device includes a cover layer 12, an LCF layer 20, one or more solar cells 40 disposed in an encapsulant 45, and a back-side layer or backsheet 50. This figure is provided to represent a typical solar cell/solar panel design incorporating the light control structures of the present invention. As would be understood by one of skill in the art given the present description, alternative solar cell/solar panel constructions can be utilized that include the light control structures (e.g., LCFs) described herein.

The cover layer 12 can be formed from a protective material, such as glass, barrier film, or ultra-barrier film. This layer can be used to protect the interior layers of the device from outside elements, such as rain, dirt, sand, etc. In the embodiment shown in FIG. 1, incident light 5 is incident on a first major surface of cover layer 12. Although shown as a smooth outer surface, cover layer 12 may be smooth, textured, lensed or coated with layers to incorporate anti-reflection and/or anti-soiling features.

In one aspect of the invention, cover layer 12 is disposed on LCF 20. In this aspect, LCF layer 20 is a separate layer from cover layer 12. In an alternative aspect, the LCF layer 20 can be combined with an adhesive 42 to bond the cover layer 12 to the encapsulant 45. In a further alternative, a layer of optical elements 18, such as an ordered unitary lens structure, can be disposed between the cover layer 12 and LCF 20.

The encapsulant 45, cells 40 (e.g., PV cells 40*a* and 40*b*) and backsheet layer 50 can comprise the materials described above.

In particular, LCF layer 20 can include a plurality of magnetizable particles ordered and aligned within a binding matrix or resin to form a louver film having alternating light transmissive regions 21 and light blocking regions 22. The LCF layer 20 includes a light input surface 23 and a light output surface 24 opposite the light input surface 23. The light input surface and light output surface are labeled for reference purposes only, but the LCFs of the present disclosure may be flipped upside down. That is, in some embodiments, the light output surface in the LCFs described herein may act as a light input surface and the light input surface may act as a light output surface, depending on the orientation of the film and the location of the light source. In some embodiments, light blocking regions 22 may extend from light input surface 23 to light output surface 24.

In another embodiment, LCF layer 20 consists of a plurality of magnetizable particles ordered and aligned within a binding matrix to form a louver film having alternating light transmissive regions 21 and light blocking regions 22. In another aspect, the light blocking regions are angled at a louver angle from greater than 0° to about 50°.

In certain preferred embodiments, regions 21 are substantially transmissive to visible light, ultraviolet light, and infrared light. In other embodiments, the transmission properties of the regions 21 can be adjusted so that they may be transmissive or absorptive in the visible, ultraviolet, and/or infrared spectra, with transmission or absorption in each spectral range being adjusted independently of the other ranges. In some embodiments, regions 22 are spectrally selective absorptive regions and absorption is limited to particular wavelength ranges of the solar spectrum. In some embodiments, regions 22 are spectrally selective reflective regions and reflection is limited to particular wavelength ranges of the solar spectrum.

In certain preferred embodiments, regions 22 are not substantially transmissive to visible light, but are transmissive to infrared and/or ultraviolet radiation. In other preferred embodiments, regions 21 are substantially transmissive to visible light, ultraviolet light, and infrared light, regions 22 are substantially transmissive to ultraviolet light and infrared light but are not substantially transmissive to visible light.

As shown in FIG. 1, regions 22 can be spaced apart (in a non-random manner), aligned regions, that are disposed at a non-normal angle from surface 23. These regions 22 can have depth, thickness, height, and/or length in multiple dimensions. For example, spacing distances between regions 22 (e.g., groupings of magnetizable particles/louver structures) within the same desired structure may be about 5 mm or less, or about 4 mm or less, or about 3 mm or less, or about 2 mm or less, or about 1 mm or less, or about 0.5 mm or less, or about 0.25 mm or less, or about 0.1 mm or less, or about 0.05 mm. Regions 22 are shown as non-random but spacing may have some randomness over the extent of the article. As such, the spacing distance between louver structures may be substantially the same for adjacent louver structures, but some randomness in spacing may exist over the extent of the article that does not significantly affect optical performance.

As is described in further detail herein, these light blocking regions can be tilted at a selected angle, thereby operating as a louver-type structure having a selected light transmissive angle. The inventors have observed that control over the arrangement and the shape (geometry) of the regions 22 can improve the efficiency of the LCF in allowing a maximum amount of radiation to pass through the film towards the photovoltaic (PV) surface, while concealing such surface from a viewer. Such control can be provided by the methods described further herein.

Figure 2A:
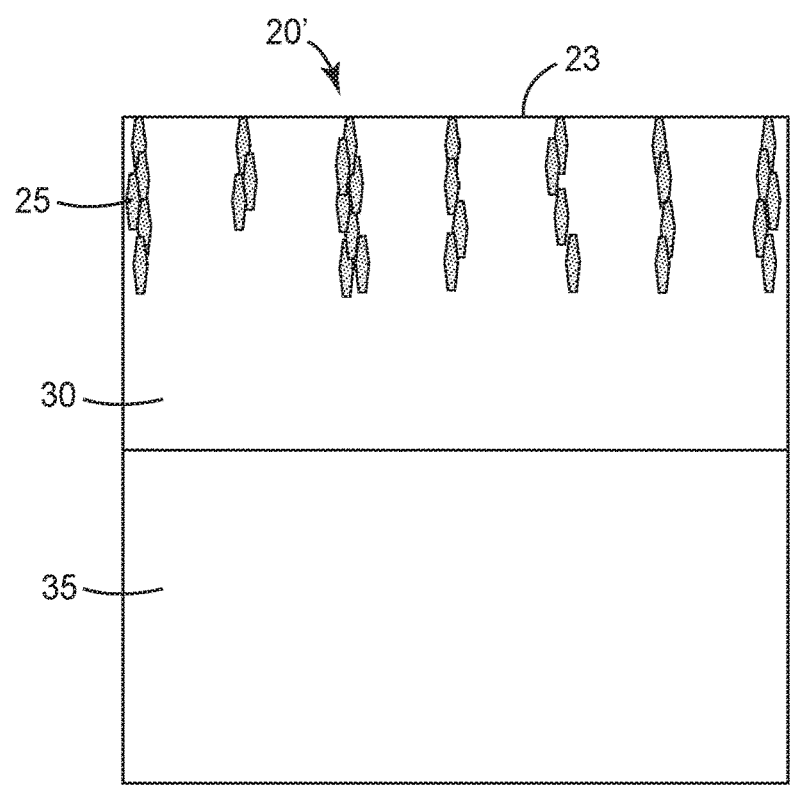
FIG. 2A is a schematic cross section view of a light control structure in the form of a light control film having aligned magnetizable particles in accordance with another embodiment of the present invention.
Figure 2B:
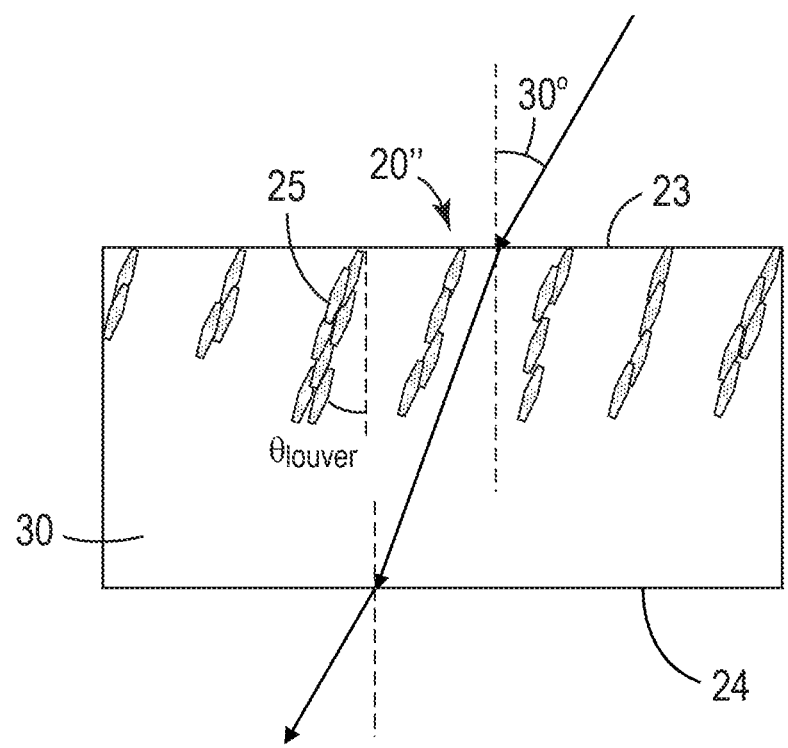
FIG. 2B is a schematic cross section view of a light control structure in the form of a light control film having aligned and tilted magnetizable particles in accordance with another embodiment of the present invention.

As such, a light control structure can comprise groupings of magnetizable particles (with each spaced apart grouping of particles referred to as a louver structure, and the light control structure comprises an array or series of louver structures) each aligned at least in a first orientation, wherein each grouping of particles is spaced apart from an adjacent grouping, such as shown in FIGS. 2A and 2B.

The LCFs may be sized to be utilized with conventional solar cell or solar panel structures, which can have dimensions such as 1.67 m×1.0 m for a conventional 60 cell panel, or other conventional sizes. The louver structures may have any of the widths described herein.

FIGS. 2A and 2B show alternative cross section views of LCF layers 20' and 20". In FIG. 2A, LCF layer 20' includes a plurality of magnetizable particles 25 that are dispersed in a binding matrix or resin 30 (described in further detail below) and that are ordered and aligned in accordance with the methods described herein. In this aspect, groupings of particles 25 are formed in planes that are spaced apart from each other by a spacing distance and are aligned normal to surface 23 (and extend into or out of the dimension of the page). Optionally, LCF 20 can be formed on a removable carrier film 35, which is removed during the construction of device 10. Alternatively, in FIG. 2B, LCF layer 20" includes several groupings, each grouping having a plurality of magnetizable particles 25, that are dispersed in a binding matrix or resin 30, and that are spaced apart by a spacing distance, ordered and aligned at an angle $\Theta_{louver}$ with respect to the normal of surface 23, such that groupings of particles 25 are formed in planes that are tilted at an angle $\Theta_{louver}$ with respect to the surface 23. Angle $\Theta_{louver}$, also referred to herein as the tilt angle or louver angle, can be from about 0° to about 70° (depending, e.g., on the transmittance of the magnetizable particles being used and the index of refraction of the binding matrix), preferably from about 0° to about 50°, more preferably from about 0° to about 40°, even more preferably from about 0° to about 30°, noting that 42.1° is the critical angle for glass (which has an index of refraction (n)=1.5). In the example of FIG. 2B, $\Theta_{louver}$ is 20°. As shown in FIGS. 2A and 2B, each grouping of magnetizable particles 25 can be about the same density and/or thickness within a plane or a varying density and/or thickness within a plane, where the planes are substantially parallel to one another. Alternatively, each grouping of magnetizable particles 25 can have a varying height in the plane of FIGS. 2A and 2B and or lengths out of plane of these figures. The louver structures 25 can be oriented at slightly different louver angles and may not be strictly parallel in the plane of the film or thickness direction. Some randomness of the louver structures may yield a non-uniform appearance, which may be desirable for some applications, while other applications may require a substantially uniform appearance.

In this manner, LCF 20, 20', 20" can be formed as a louver film or multiple films used to camouflage the device 10 from certain viewing regions while allowing high solar transmission. For example, the louver film(s) can be placed between the viewer and the photovoltaic (e.g., Si, CIGS, Perovskite, and the like) cells. The louver film(s) may also be designed to appear a certain color to the viewer, such that it can blend in with the tile of the roof, and/or have an aesthetically pleasing tile-like appearance. It is a benefit of various embodiments of the present invention to have such a louver film(s) absorb or reflect only as much as is needed for the desired color appearance. Wavelengths not contributing to the color appearance of the module can transmit through the thickness of the louver film. This can be accomplished with reflection off the louver film, transmission through the louver film or a combination. The louver films can be configured to prevent reflection of light, or certain wavelengths of light, off of the solar cell, thus hiding them from a viewer (such as a person looking at a house from street level—see e.g., FIG. 3A). The maximum transmission can be selected to correspond to a particular roof pitch and/or latitude of the sun's path.

With respect to FIG. 2B, the light ray shown striking the surface of the film at a 30° angle of incidence is refracted to an angle roughly parallel to the louver structure. This ray and parallel rays will interact with the louver structure the least and thus have the greatest incidence angle transmittance through the film. Measurements of the angular transmittance through the film can be readily measured using standard photometric detectors with a rotation stage to change the angle of incidence. The transmittance through the LCF 20, 20', 20" can be obtained over any waveband of interest. For instance, for PV cells, it may be desired to average the transmittance over the useful wavelengths of the PV cell, e.g., 350 nm-1200 nm. Other applications may be interested over the visible waveband (400 nm-700 nm) or other sub-bands within the electromagnetic spectrum.

An angular profile of the transmittance through the film can be obtained from which the (maximum) relative brightness ratio (RBR), incidence angle of maximum RBR and effective polar viewing angle can be obtained.

Figure 3A:
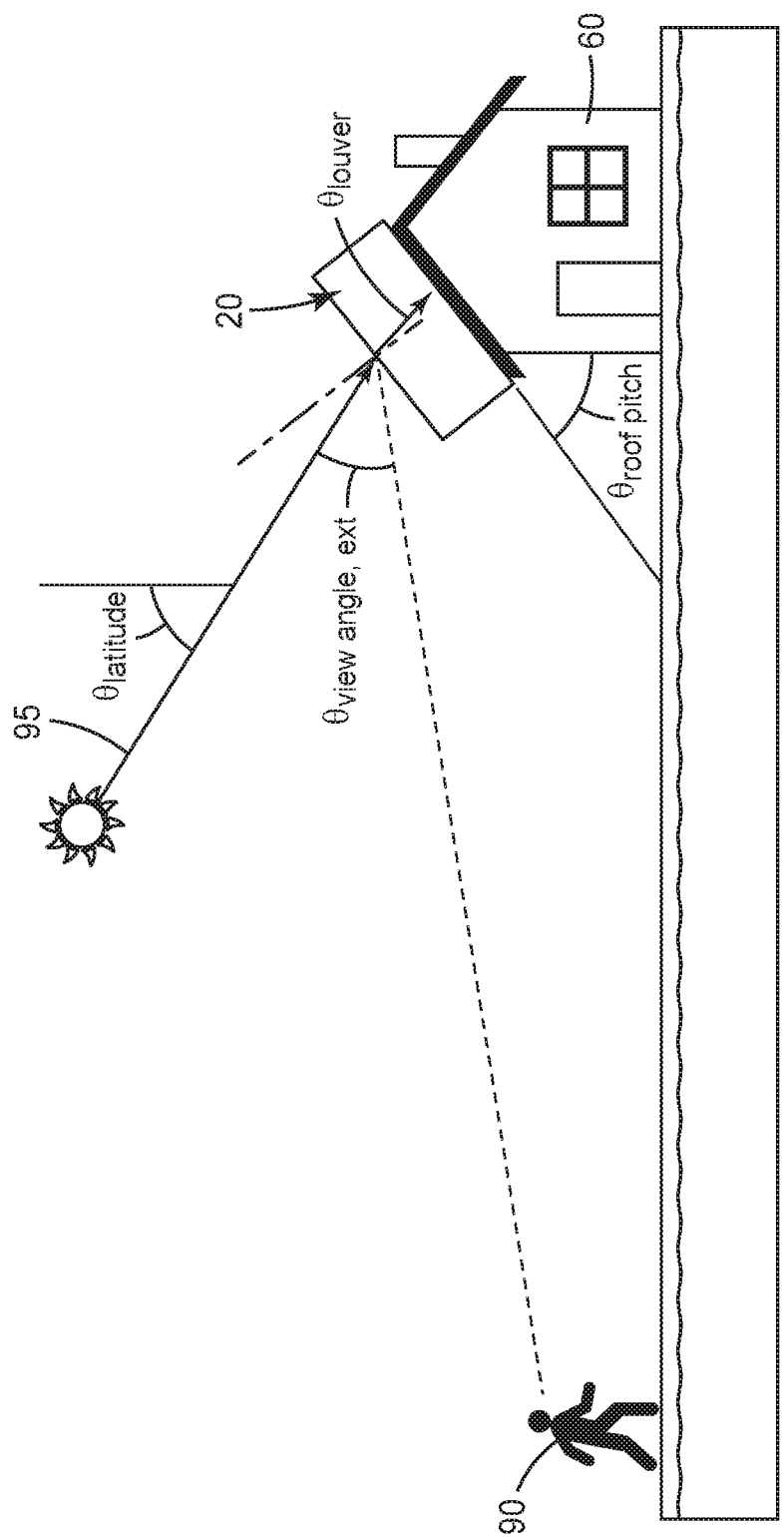
FIG. 3A is a schematic view of an exemplary solar panel in accordance with an embodiment of the present invention installed on the roof of a house.

FIG. 3A shows schematic view of an exemplary solar device in accordance with an embodiment of the present invention (e.g., a solar panel installed on the roof of a house 60). In this illustration, the solar panel features are removed, except for LCF 20 (which is shown in an exaggerated relative size). For maximum solar transmission, an optimal louver angle ($\Theta_{louver\ optimal}$) with respect to the louver film surface 23 should be centered on the refracted ray from the solar position 95 at noon on the Spring or Autumnal Equinox in the location of interest. This louver angle ($\Theta_{louver\ optimal}$) can be selected based on the absolute value of the difference between the latitude ($\Theta_{latitude}$) and roof pitch ($\Theta_{roof\ pitch}$):

$$\theta_{louver\ optimal} = |\theta_{latitude} - \theta_{roof\ pitch}|.$$

Figure 3B:
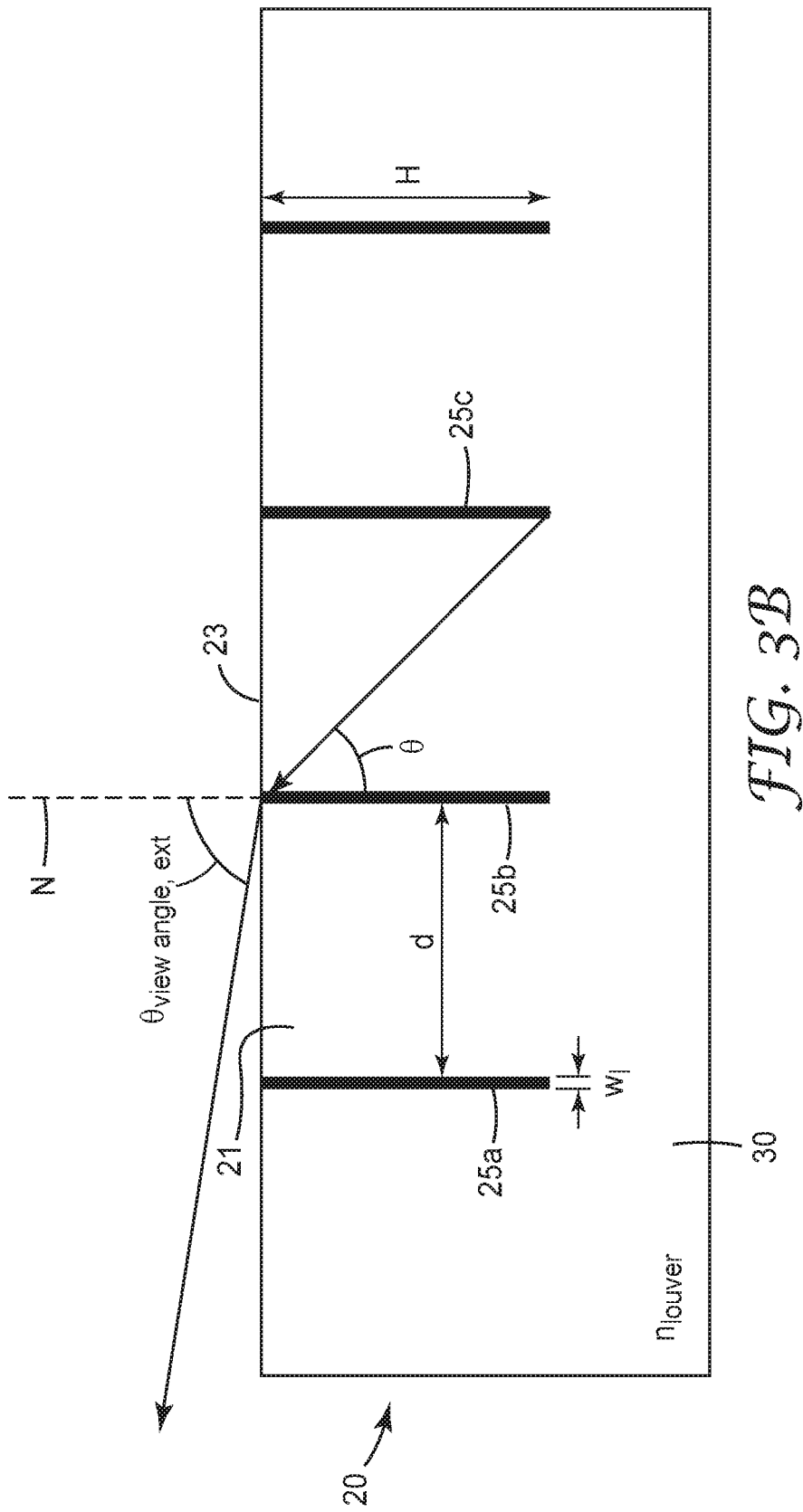
FIG. 3B shows the calculation for the viewing angle for a louver film having a louver structures formed perpendicular to a light incident surface.
Figure 3C:
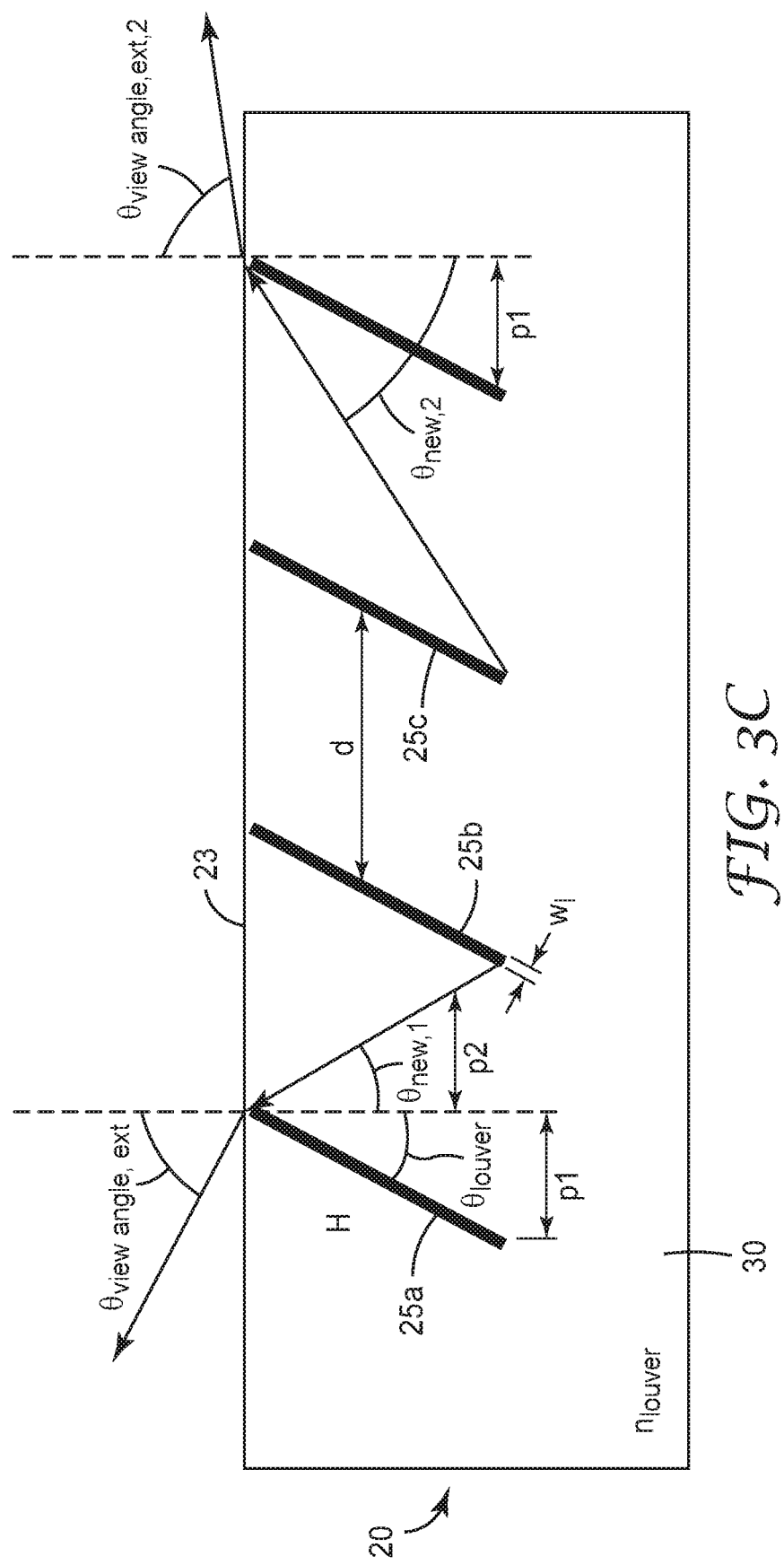
FIG. 3C shows the calculation for the viewing angle for a louver film having a louver structures formed at a non-perpendicular angle to a light incident surface.

The external viewing angle $\Theta_{view\ angle\ ext}$ can be obtained from the louver geometry illustrated in FIGS. 3B and 3C.

FIG. 3B shows the calculation for the viewing angle ($\Theta_{view\ angle\ ext}$) for a louver film 20 having louver structures 25 (e.g., grouping of magnetizable particles 25a, 25b, etc.) formed perpendicular to a light incident surface 23, where the tilt angle or louver angle ($\Theta_{louver}$)=0° with respect to the normal (N) to light incident surface 23. In FIG. 3B, each louver structure 25 has a height H, a width ($w_l$) and is spaced apart from another louver structure by a spacing distance (d), where d=spacing distance from louver structure edge to adjacent louver structure opposite edge—louver width ($w_l$). Using an internal angle $\Theta$ in light transmitting region 21 (see e.g., FIG. 1), the external viewing angle $\Theta_{view\ angle\ ext}$ can be calculated according to the following equations:

$$\theta = \tan^{-1}\left(\frac{d}{H}\right)$$

$$\theta_{view\ angle\ ext} = \sin^{-1}(n_{louver} * \sin\theta)$$

The external viewing angle is the maximum geometrical angle from the proximal end of one louver to the distal end of the adjacent louver. This is defined by the louver matrix index of refraction ($n_{louver}$) (see e.g., region 21 from FIG. 1), louver spacing (d), louver height (H) and louver width ($w_l$). The internal angle is equal to the inverse tangent of region 21 spacing distance (d) divided by the louver height. The external viewing angle is determined by Snell's law and is symmetric. While FIG. 3B assumes a planar outer surface, one skilled in the art would be able to predict the impact of an uneven, curved, or roughened outer surface given the present description.

FIG. 3C shows the calculation for multiple viewing angles ($\Theta_{view\ angle\ ext,1}$) and ($\Theta_{view\ angle\ ext,2}$) for a louver film 20 having louver structures 25 (e.g., grouping of magnetizable particles 25a, 25b, etc.) formed at non-zero louver angles ($\Theta_{louver}$) with respect to the normal to the light incident surface 23. For such tiled louver structures, the external viewing angle is not symmetric. The external viewing angles are determined in a similar manner as above:

$$H' = H\cos\theta_{louver}$$

$$p1 = H\sin\theta_{louver}$$

$$p2 = d - p1$$

$$\theta_{new,1} = \tan^{-1}\left(\frac{p2}{H'}\right)$$

$$\theta_{new,2} = \tan^{-1}\left(\frac{d+p1}{H'}\right)$$

$$\theta_{view\ angle\ ext,1} = \sin^{-1}(n_{louver} * \sin\theta_{new,1})$$

$$\theta_{view\ angle\ ext,2} = \sin^{-1}(n_{louver} * \sin\theta_{new,2})$$

Louver angles $\Theta_{louver}$ larger than the critical angle of the louver film media may result in inefficiencies. For planar outer surfaces, light cannot travel at angles larger than the critical angles. If the louvers are larger than this angle, some of the light will strike the louver resulting in some losses.

As FIGS. 3A-3C illustrate, solar cells and solar panels can be assembled having louver films designed for particular geographic locations, roof pitches, and roof styles that will maximize solar transmission while still providing camouflage of the structures themselves for aesthetic appeal.

For example, in one embodiment of the invention, the maximum relative brightness ratio (RBR) is at least 50%. This can be achieved using an LCF construction consistent with that described herein.

Given the description herein, and as evidenced by the experiments below, in one embodiment, a light control film can be configured such that light incident on the light input surface exits the light output surface having a maximum relative brightness ratio (RBR) in the major viewing axis direction of 50% or greater and an effective polar viewing angle (EPVA) of 150° or less.

In another embodiment, a light control film can be configured such that light incident on the light input surface exits the light output surface having a maximum relative brightness ratio (RBR) in the major viewing axis direction of 60% or greater.

In another embodiment, a light control film can be configured such that light incident on the light input surface exits the light output surface having a maximum relative brightness ratio (RBR) in the major viewing axis direction of 80% or greater.

In another embodiment, the light control film is configured such that the incidence angle of maximum relative brightness ratio (RBR) is 80° or less.

In another embodiment, the light control film is configured such that the incidence angle of maximum relative brightness ratio (RBR) is greater than 10° and less than 80°.

In another embodiment, the light control film includes multiple louver structures having a non-zero louver angle with respect to the light incident surface, wherein the EPVA is asymmetric about the incidence angle of maximum relative brightness ratio.

In another embodiment, the light control film includes louver structures having non-zero louver angles with respect to a normal to a light incident surface, wherein the incidence angle of RBR on a first side of a normal to the light incident surface is greater than 70° and less than 70° on a second side of the normal.

Figure 4A:
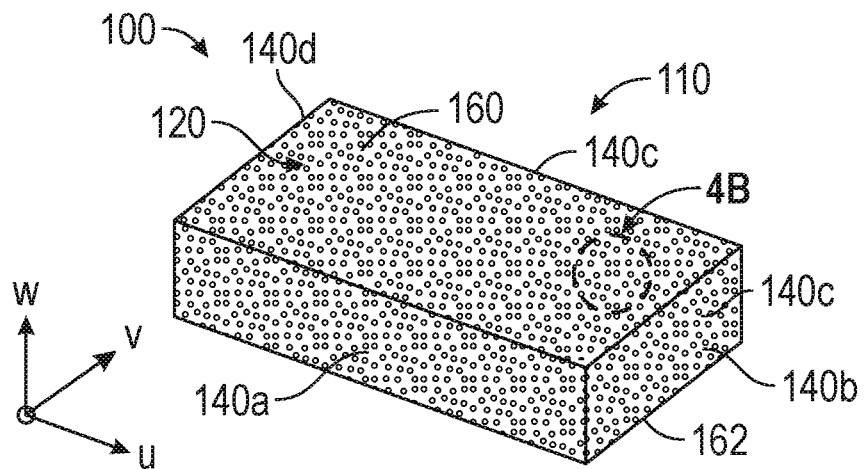
FIG. 4A is a schematic perspective view of a magnetizable particle according to one embodiment of the present disclosure.
Figure 4B:
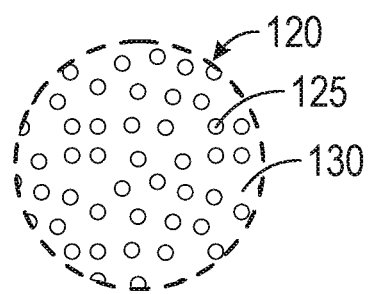
FIG. 4B is an enlarged view of region 4B in FIG. 4A.

Various constructions of a louver film, such as LCF 20, can be accomplished in accordance with the methods described herein. Magnetizable particles are described herein by way of example and can have various configurations. For example, the magnetizable particles can be constructed of various materials including but not limited to ceramics, metal alloy powder, metal alloys, glass particles coated to be magnetizable, mica particles coated to be magnetizable, composites or the like. Similarly, the magnetizable particles can be substantially entirely constructed of magnetizable material, can have magnetizable portions disposed therein (e.g., ferrous traces), or can have magnetizable portions disposed as layers on one or more surfaces thereof (e.g., one or more surfaces can be coated with a magnetizable material) according to some examples. The magnetizable particles can be shaped according to some examples, such as shown in the example of FIGS. 4A and 4B. According to other examples the magnetizable particles can comprise, flakes, crush grains, agglomerates, or the like. Magnetizable particles can be used in loose form (e.g., free-flowing or in a slurry) prior to cure and can be incorporated into various articles including the optical films discussed herein.

Referring now to FIGS. 4A and 4B, an exemplary body 100 including a plurality of magnetizable particles 125 is disclosed. The body 100 can be a shaped body 110 that has been coated with a magnetizable material 120. According to some examples, the body 110 need not be shaped but can be random. Furthermore, the body 110 can be formed of a magnetizable material and need not be coated. The magnetizable material 120 can be comprised of magnetizable particles 125 (e.g., iron) retained in a binder matrix 130 (also referred to simply as "binder") as further shown in FIG. 4B. If shaped, as it need not be in many embodiments, but as shown in the embodiment of FIG. 4A, the body 110 can have two opposed major surfaces 160, 162 connected to each other by four minor side surfaces 140*a*, 140*b*, 140*c* and 140*d*. Magnetizable particles of the type shown can be moveable to align with magnetic field lines of force as will be discussed subsequently to form desired structures.

The magnetizable material 120 can be a unitary magnetizable material, or it can comprise magnetizable particles in a binder matrix. Suitable binders can be vitreous or organic, for example, as described for the binder matrix 130 hereinbelow. The binder matrix can be, for example selected from those vitreous and organic binders. The body 110 can comprise ferrous materials or non-ferrous material(s), for example.

If the magnetizable material comprises a layer coated on the body 100 as shown in the embodiment of FIG. 4A, this can be accomplished by any suitable method such as, for example, dip coating, spraying, painting, physical vapor deposition, and powder coating. Individual magnetizable particles can have magnetizable layers with different degrees of coverage and/or locations of coverage. The magnetizable material can be essentially free of (i.e., containing less than 5 weight percent of, in yet other cases containing less than 1 weight percent of) materials used in the shaped body 110. The magnetizable layer can consist essentially of magnetizable materials (e.g., >99 to 100 percent by weight of vapor coated metals and alloys thereof), or it can contain magnetizable particles retained in a binder matrix. The binder matrix of the magnetizable layer, if present, can be inorganic or organic resin-based, and is typically formed from a respective binder precursor.

Magnetizable particles according to the present disclosure can be prepared, for example, by applying a magnetizable layer or precursor thereof to the body 110. Magnetizable layers can be provided by physical vapor deposition as discussed hereinbelow. Magnetizable layer precursors can be provided as a dispersion or slurry in a liquid vehicle. The dispersion or slurry vehicle and can be made by simple mixing of its components (e.g., magnetizable particles, optional binder precursor, and liquid vehicle), for example. Exemplary liquid vehicles include water, alcohols (e.g., methanol, ethanol, propanol, butanol, ethylene glycol monomethyl ether), ethers (e.g., glyme, diglyme), and combinations thereof. The dispersion or slurry can contain additional components such as, for example, dispersant, surfactant, mold release agent, colorant, defoamer, and rheology modifier. Typically, after coating onto the ceramic bodies the magnetizable layer precursor is dried to remove most or all of the liquid vehicle, although this is not a requirement. If a curable binder precursor is used, then a curing step (e.g., heating and/or exposure to actinic radiation) generally follows to provide the magnetizable layer.

Vitreous binder can be produced from a precursor composition comprising a mixture or combination of one or more raw materials that when heated to a high temperature melt and/or fuse to form a vitreous binder matrix. Further disclosure of appropriate vitreous binders that can be used with the article can be found in Published PCT Appl. WO 2018/080703; WO 2018/080756; WO 2018/080704; WO 2018/080705; WO 2018/080765; WO 2018/080784; WO 2018/080755; and WO 2018/080799; each of which are incorporated herein by reference in their entirety.

In some embodiments, the magnetizable layer can be deposited using a vapor deposition technique such as, for example, physical vapor deposition (PVD) including magnetron sputtering. PVD metallization of various metals, metal oxides and metallic alloys is disclosed in, for example, U.S. Pat. No. 4,612,242 (Vesley) and U.S. Pat. No. 7,727,931 (Brey et al.). Magnetizable layers can typically be prepared in this general manner.

As discussed previously, the body of the magnetizable particle can be shaped (e.g., precisely-shaped) or random (e.g., flake, crushed, sphere, etc.). Exemplary shapes include squares, spheres, rectangles, pyramids (e.g., 3-, 4-, 5-, or 6-sided pyramids), truncated pyramids (e.g., 3-, 4-, 5-, or 6-sided truncated pyramids), cones, truncated cones, rods (e.g., cylindrical, vermiform), platelets, discs, and prisms (e.g., 3-, 4-, 5-, or 6-sided prisms).

Exemplary magnetizable materials that can be suitable for use in magnetizable particles can comprise: iron; cobalt; nickel; various alloys of nickel and iron marketed as Permalloy in various grades; various alloys of iron, nickel and cobalt marketed as Fernico, Kovar, FerNiCo I, or FerNiCo II; various alloys of iron, aluminum, nickel, cobalt, and sometimes also copper and/or titanium marketed as Alnico in various grades; alloys of iron, silicon, and aluminum (typically about 85:9:6 by weight) marketed as Sendust alloy; Heusler alloys (e.g., $Cu_2MnSn$); manganese bismuthide (also known as Bismanol); rare earth magnetizable materials such as gadolinium, dysprosium, holmium, europium oxide, alloys of neodymium, iron and boron (e.g., $Nd_2Fe_{14}B$), and alloys of samarium and cobalt (e.g., $SmCo_5$); MnSb; $MnOFe_2O_3$; $Y_3Fe_5O_{12}$; $CrO_2$; MnAs; ferrites such as ferrite, magnetite; zinc ferrite; nickel ferrite; cobalt ferrite, magnesium ferrite, barium ferrite, and strontium ferrite; yttrium iron garnet; and combinations of the foregoing. In some embodiments, the magnetizable material comprises at least one metal selected from iron, nickel, and cobalt, an alloy of two or more such metals, or an alloy of at one such metal with at least one element selected from phosphorus and manganese. In some embodiments, the magnetizable material is an alloy (e.g., Alnico alloy) containing 8 to 12 weight percent (wt. %) aluminum, 15 to 26 wt. % nickel, 5 to 24 wt. % cobalt, up to 6 wt. % copper, up to 1 wt. % titanium, wherein the balance of material to add up to 100 wt. % is iron.

The magnetizable particles can have a major dimension of any size relative to a thickness or the optical films they are a part of but can be much smaller than the thickness of the optical films in some instances. For example, they can be 1 to 2000 times smaller in some embodiments, in yet other embodiments 100 to 2000 times smaller, and in yet other embodiments 500 to 2000 times smaller, although other sizes can also be used.

Figure 5:
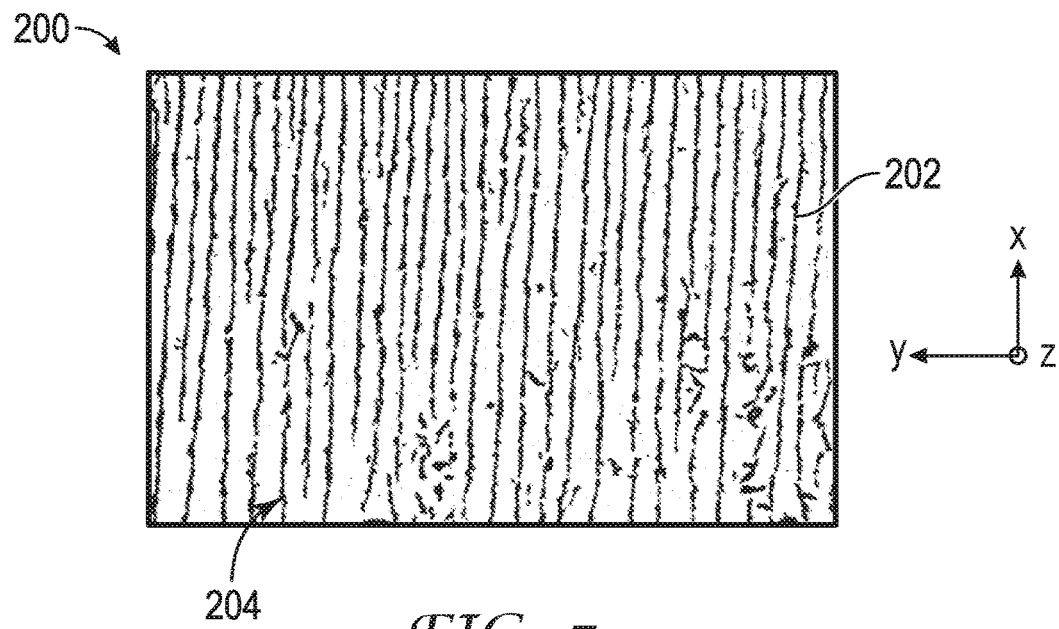
FIG. 5 is an image of a plurality of magnetizable particles arranged with a desired structure due to the application of a magnetic field on a substrate according to an example of the present disclosure.

FIG. 5 is an image of an optical film 200 with a plurality of magnetizable particles 202 that have been organized into a desired structure with a majority of the magnetizable particles exhibiting a non-random positioning along lines of force due to the application of a modulated magnetic field. As shown in FIG. 5, at least a majority of the plurality of magnetizable particles 202 are aligned and spaced into a desired structure 204 having distinctive rows. In FIG. 5, the plurality of magnetizable particles 202 comprise Sendust. The Sendust particles account for substantially 20% of the optical film by weight percentage and are applied as a slurry onto a substrate. The Sendust particles are initially dispersed in the optically clear resin in a random manner. Types of resin families suitable for various embodiments of the present invention include but are not limited to: a combination of a first and a second polymerizable component selected from (meth)acrylate monomers and (meth)acrylate oligomers, and mixtures thereof. As used herein, "monomer" or "oligomer" is any substance that can be converted into a polymer. The term "(meth)acrylate" refers to both acrylate and methacrylate compounds. In some cases, the polymerizable composition can comprise a (meth)acrylated urethane oligomer, (meth)acrylated epoxy oligomer, (meth)acrylated polyester oligomer, a (meth)acrylated phenolic oligomer, a (meth)acrylated acrylic oligomer, and mixtures thereof. The polymerizable resin optionally, yet preferably further comprises at least one crosslinker having three or more (meth)acrylate groups. The polymerizable composition may optionally include a (e.g. monofunctional) reactive diluent. The polymerizable resin can be a radiation curable polymeric resin, such as a UV curable resin. Radiation (e.g. UV) curable compositions generally include at least one photoinitiator. The photoinitiator or combination of photoinitiators can be used at a concentration of about 0.1 to about 10 weight percent. More preferably, the photoinitiator or combination thereof is used at a concentration of about 0.2 to about 3 weight percent. In general, the photoinitiator(s) are at least partially soluble (e.g. at the processing temperature of the resin) and substantially colorless after being polymerized. The photoinitiator may be (e.g. yellow) colored, provided that the photoinitiator is rendered substantially colorless after exposure to the UV light source. Types of resin families can also include but are not limited to: a polymerizable resin comprised of high polymers, epoxides and/or siloxanes.

The resin can be at least partially vitrified after the Sendust particles are organized into the desired structure by the applied magnetic field. Due to the high aspect ratio of the Sendust flakes and that, in some cases, such flakes fall over on their sides, there can be initially little to no transmission through the slurry prior to organization by the magnetic field. Once the magnetic field is applied, the Sendust particles are organized into the desired structure, with the field lines orienting the Sendust particles (comprising flakes) upward and aligning them relative to one another. This desired structure achieves the ability of light transmission through the optical film 200 in the normal direction (parallel to the z-axis) and any angle in the x-z plane but also limits light transmission at oblique angles to the optical film 200 (in the y-z plane). The angle at which light is blocked as well as the magnitude of how quickly the transmission is reduced from when the optical film is angled away from perpendicular to the viewing direction, can be controlled by the percent loading by weight of Sendust to optically clear resin and other techniques and features that affect the construct of the optical film as will be discussed in greater detail subsequently.

Figure 6:
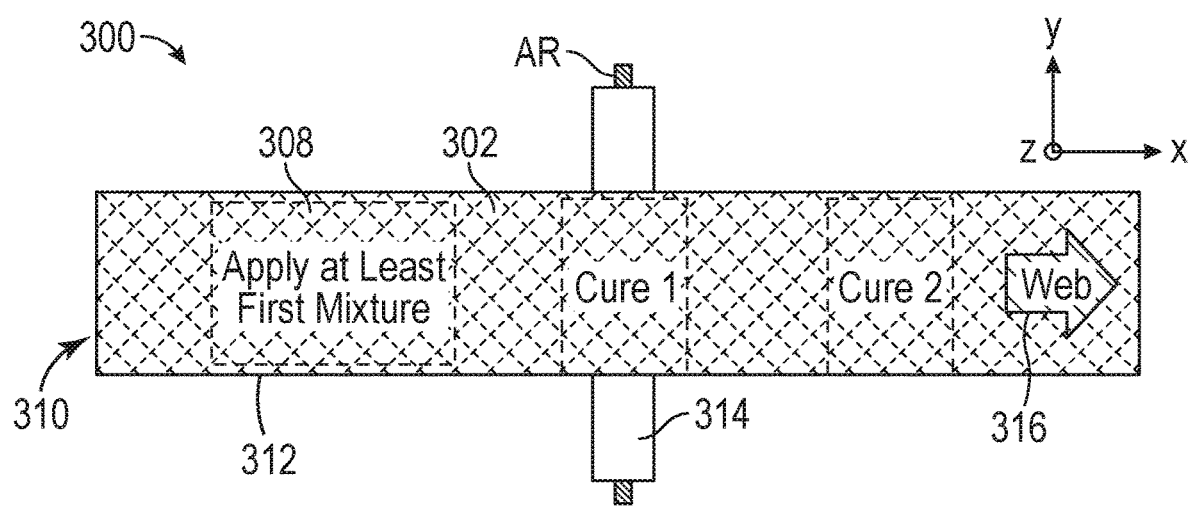
FIG. 6 is schematic view of a first method of making an optical film, the method varies a magnetic field by rotating modulation and applies a cure, wherein under the influence of the magnetic field, the plurality of magnetizable particles assume a desired structure according to an example of the present disclosure.
Figure 6A:
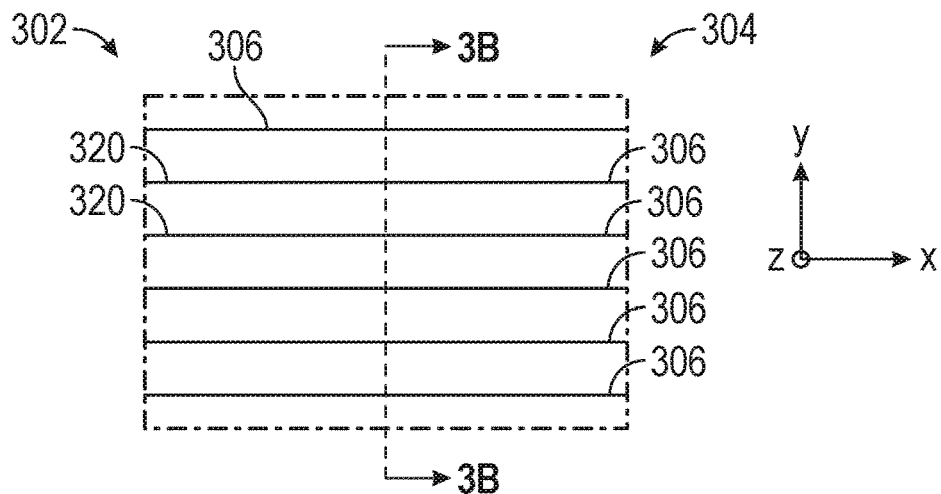
FIG. 6A is an example structure having a plurality of magnetizable particles that results from the magnetic field of the method of FIG. 6 according to an example of the present disclosure.

FIG. 6 shows a method 300 for making an optical film 302 according to one embodiment of the present disclosure. FIG. 6A shows a desired structure 304 of the plurality of magnetizable particles 306 that results from the magnetic field of the method of FIG. 6. It should be noted that in FIG. 6A, and in the subsequently shown and described methods and the desired structures of also referred to herein, that the desired structures, methods and optical films are shown on a larger scale (high level) such that individual of the plurality of magnetizable particles are not specifically shown. Thus, each row (shown as a line) of the desired structures will be comprised of some of the plurality of the magnetizable particles. It should be recognized that the desired structures are comprised of the plurality of magnetizable particles, which may be spaced from one another even when grouped in rows along lines of force as shown in FIG. 5. It should be further recognized that for the disclosed methods a majority (or more) of the plurality of magnetizable particles may exhibit the desired structure and the desired structures shown herein are shown in a highly schematic manner that does not show some degree of randomness that can occur in the orientation, alignment and/or positioning of at least some (less than a majority) of the plurality of magnetizable particles. This randomness is shown in some areas of the optical film of FIG. 5.

Figure 6B:
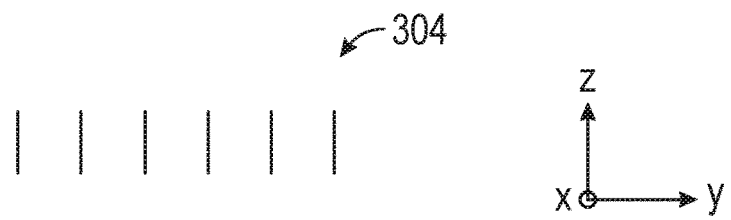
FIG. 6B shows a cross-section of FIG. 6A.

The method 300 is operable to provide the plurality of magnetizable particles 306 with the desired structure 304 within the optical film 302 as shown in FIG. 6A. FIG. 6B shows a cross-section of FIG. 6A showing the desired structure 304 from another perspective. The plurality of magnetizable particles 306 can have a construction similar to those previously illustrated or described. According to one embodiment and now referencing FIG. 6, the magnetizable particles can be dispersed in an optically clear resin (in the electromagnetic spectrum range of interest) to form a first mixture 308. The optically clear resin can have a composition the same as the examples provided in reference to FIG. 5. The first mixture 308 can be positioned on a web 310 (comprising a substrate 312). The plurality of magnetizable particles 306 can be by weight percentage anywhere from 0.01% to 90% relative to the weight percentage of the resin. The particular chemical composition and thickness of the substrate 312 can depend on the requirements of the particular optical product that is being constructed. That is, balancing the needs for strength, clarity, temperature resistance, surface energy, adherence to the optical layer, among others. The thickness of the substrate 312 is typically at least about 0.025 millimeters (mm) and more typically at least about 0.125 mm. Further, the substrate 312 generally has a thickness of no more than about 0.5 mm.

Useful substrate materials include, for example, styrene-acrylonitrile, cellulose acetate butyrate, cellulose acetate propionate, cellulose triacetate, polyether sulfone, polymethyl methacrylate, polyurethane, polyester, polycarbonate, polyvinyl chloride, polystyrene, polyethylene naphthalate, copolymers or blends based on naphthalene dicarboxylic acids, polyolefin-based material such as cast or orientated films of polyethylene, polypropylene, and polycyclo-olefins, polyimides, and glass. Optionally, the substrate material can contain mixtures or combinations of these materials. In an embodiment, the substrate may be multi-layered or may contain a dispersed component suspended or dispersed in a continuous phase.

Further examples of substrates include polyethylene terephthalate (PET) and polycarbonate. Examples of useful PET films include photograde polyethylene terephthalate and available from DuPont Films of Wilmington, Del. under the trade designation "Melinex 618".

Optionally, a second substrate (which can be similar or dissimilar in composition and thickness as the first substrate 312) may be laminated (e.g. bonded using an optically clear adhesive) to the optical film 302 to provide improve clarity, to protect the optical layer 304, to provide a desired physical property to the optical film 302, etc.

The first mixture 308 can be applied up-web of a magnet 314 (permanent or electromagnet). The magnet 314 can be placed in close proximity (within a few feet) of the web 310 containing the first mixture 308 of the plurality of magnetizable particles 306 and resin. A Cartesian coordinate system is provided in FIGS. 6 and 6B to aid in understanding the positioning of the web 310 relative to the magnet 314 and in understanding the desired structure 304 of FIG. 6A. According to the embodiment shown, the Cartesian coordinate system provided can have an axis (x-axis) oriented in the down-web/up-web direction. The (y-axis) substantially aligns with a cross-web direction of the web 310 and with an axis of rotation AR of the magnet 314. The (z-axis) substantially aligns normal to both of the x-axis and y-axis.

Figure 7:
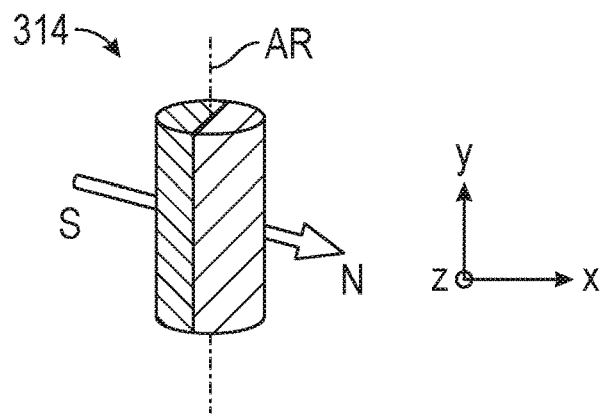
FIG. 7 is a schematic view of one example of a magnet that can create the magnet fields discussed in the present disclosure.
Figure 7A:
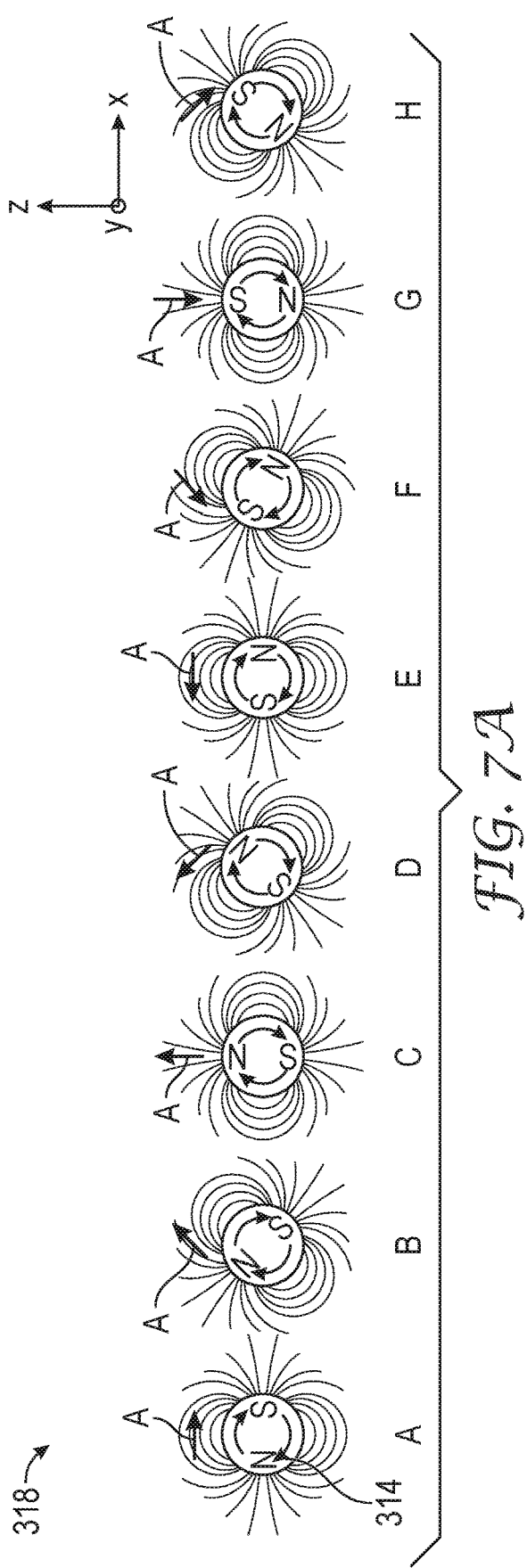
FIG. 7A is a schematic view showing the magnet of FIG. 7 with the magnetic field having rotating modulating as a result of rotation of the magnet according to an example of the present disclosure.

As shown in the example of FIG. 6, the magnet 314 is rotated about the axis of rotation AR relative to the web 310. The rotational speed of the magnet can be between 100 to 10,000 rpm or more. The web 310 can translate relative to the magnet 314 as indicated by arrow 316. FIGS. 7 and 7A show construction of the magnet 314 in further detail. FIG. 7 shows the magnet 314 can include two poles N and S that are each shaped as semi-cylinders and are disposed to either side of the axis of rotation AR. FIG. 7A shows a magnetic field 318 that is generated by the magnet 314 and rotating modulation of the magnetic field 318 that results from rotation of the magnet 314 about the axis of rotation AR (FIGS. 6 and 7). The optical film 302 and other details of the method 300 of FIG. 6 are not shown in FIG. 7A. The resolved line of force that would be exerted on the plurality of magnetizable particles 306 is indicated by arrows A in FIG. 7A.

Further examples of magnetic field configurations and apparatuses for generating them are described in U.S. Patent Publication. No. 2008/0289262 A1 (Gao) and U.S. Pat. No. 2,370,636 (Carlton), U.S. Pat. No. 2,857,879 (Johnson), U.S. Pat. No. 3,625,666 (James), U.S. Pat. No. 4,008,055 (Phaal), U.S. Pat. No. 5,181,939 (Neff), and British Pat. No. GB 1 477 767 (Edenville Engineering Works Limited), which are each incorporated herein by reference in their entirety.

Returning now to FIG. 6, according to the example embodiment, the magnet 314 is positioned to extend across a full cross-web extend of the web 310 in the y-axis direction of the Cartesian coordinate system provided. However, in some embodiments the magnet 314 may not extend the full cross-web length as shown in FIG. 6. FIG. 6 additionally shows the method 300 applies at least one cure to the optical film 302, indicated as Cure 1 in FIG. 6. The Cure 1 is applied in close proximity (within a few inches up-web or down-web) of the magnet 314. The Cure 1 can be applied by any known technique such as, but not limited to, application of ultraviolet light, application of electron beam, application or removal of thermal energy (e.g., applying heating or cooling), for example. As shown in FIG. 7A, as the magnetic field 318 is undergoing rotating modulation, the application of Cure 1 should be applied to the optical film 302 at a particular time and location where the lines of force and resolved force is oriented in a desired manner in order that the plurality of magnetizable particles are in the desired structure 304 (FIG. 6A). The Cure 1 can be a full cure (i.e. full polymerization of the resin can occur) or can be a partial cure with sufficient polymerization such that a majority of the magnetizable particles are fixed in the desired structure 304 (FIG. 6A). With a full cure no second cure (indicated as Cure 2) would be necessary in the method of FIG. 6. FIG. 6 shows the method 300 having a partial cure (Cure 1) and a second cure (Cure 2) at a down-web location to complete full polymerization.

Thus, the method 300 of FIG. 6 can make an optical film for control of light including positioning the first mixture 308 on the substrate 310. The first mixture 308 can comprise the plurality of magnetizable particles 306 dispersed in the first resin. The method 300 can include assembling the plurality of magnetizable particles 306 into the desired structure 304 for the control of the light by rotating modulation of at least the magnetic field 318 relative to the plurality of magnetizable particles 306. The method 300 can further include vitrifying (such as by the Cure 1 and/or the Cure 2 discussed above) to increase a viscosity of the first resin while the plurality of magnetizable particles 306 are in the desired structure 304.

FIG. 6A shows the desired structure 304 at a high level and in a highly schematic manner. As shown in FIG. 6A, the substrate 312 (FIG. 6) can be removed. However, in other embodiments the substrate 312 can be retained. As discussed previously, individual ones of the plurality of magnetizable particles are not shown in FIG. 6A. FIG. 6A shows a configuration for the optical film 302 with the desired structure 304 similar to that of the optical film 200 of FIG. 5. The desired structure 304 is one where the plurality of magnetizable particles are arranged in spaced rows 320 extending generally in the down-web direction. The desired structure 304 is one that allows the optical film 302 to be substantially light transmissive when viewed directly in the orientation shown in FIG. 6A (parallel to the x-z plane). However, the desired structure 304 also limits light transmission at oblique angles to the optical film 302 in the y-z plane (i.e. orthogonal to the view of FIG. 6A not within the xz-plane). It is important to note that the embodiment of FIGS. 6 and 6A is described with application of the first mixture 308 as a single layer on the substrate. However, applications of multiple layers using the same mixture or different mixture compositions are also contemplated, and indeed, are further described and illustrated in this disclosure.

Figure 8C:
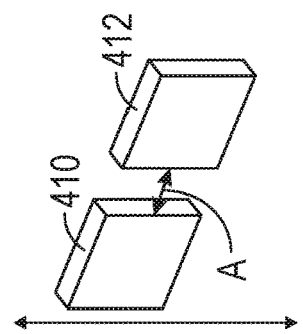
FIGS. 8A-8C are arrangements of a plurality of magnetizable particles relative to one another cross-web, down-web and thickness direction according to an example of the present disclosure.
Figure 8B:
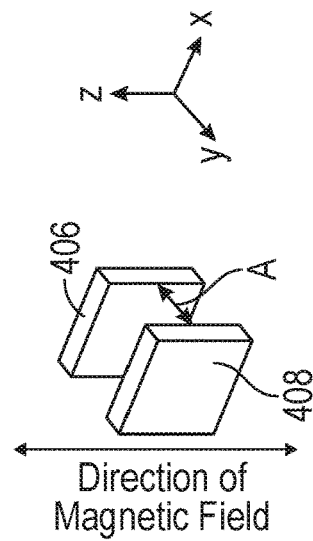
Figure 8A:
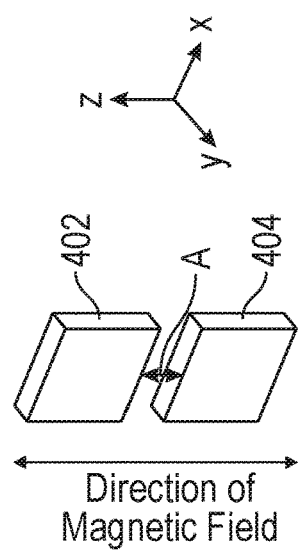

FIGS. 8A-8C show further potential orientations, positions and alignments of exemplary ones of the plurality of magnetizable particles described herein. FIG. 8A shows a particular orientation for particles 402 and 404 with minor surfaces arranged in the z and x directions of the Cartesian coordinate system (same orientation system as utilized in FIGS. 6-7A) and the major surfaces oriented in the y-direction. Such orientation is purely exemplary in nature and is used for ease of reference and description. In the multi-layer orientation of FIG. 8A the particles 402 and 404 are stacked and spaced from one another. In some embodiments, the particles 402 and 404 can be configured to be attracted or repelled from one another as indicated by arrow A.

FIG. 8B shows particles 406 and 408 that are spaced from one another in a cross-web direction. In some embodiments, the particles 406 and 408 can be configured to be attracted or repelled from one another as indicated by arrow A. FIG. 8C shows particles 410 and 412 that are spaced from one another in a down-web direction. In some embodiments, the particles 410 and 412 can be configured to be attracted or repelled from one another as indicated by arrow A. Multiple arrangements of the plurality of particles (e.g., arrangements of FIG. 8A, FIG. 8B and/or FIG. 8C) are contemplated, and indeed, are disclosed herein.

Figure 9:
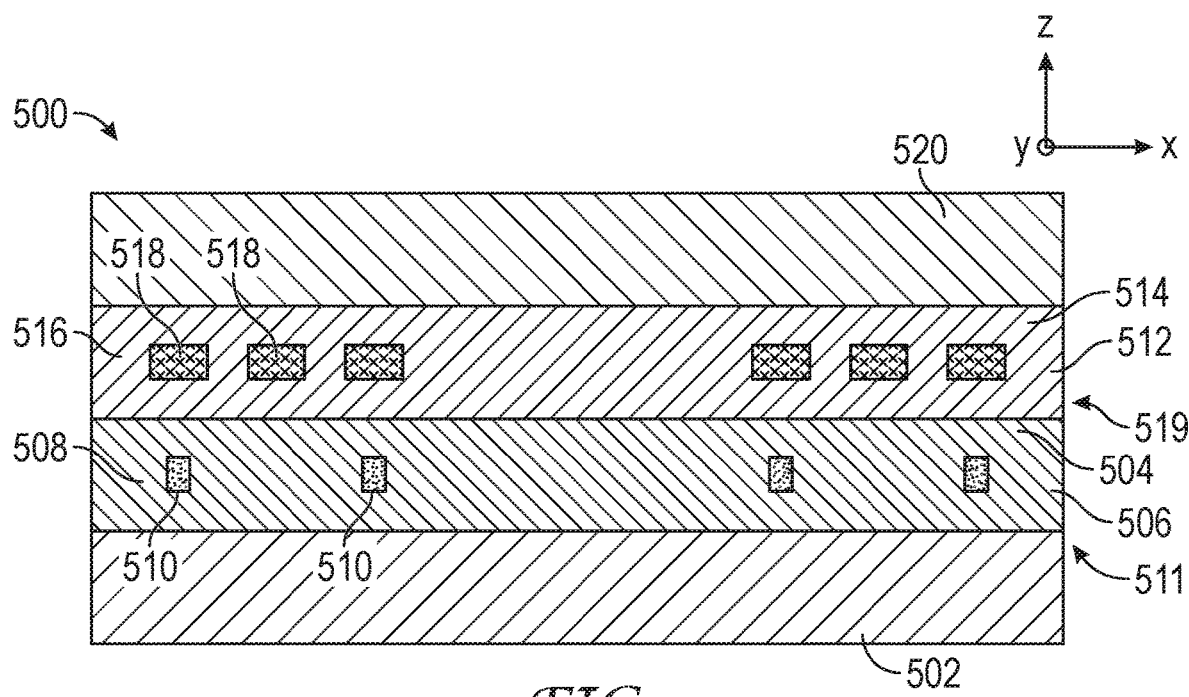
FIG. 9 is a cross-section of an exemplary optical film produced by one of the methods discussed herein and having multiple layers, wherein some of the multiple layers containing a plurality of magnetizable particles according to an example of the present disclosure.

FIG. 9 shows one possible configuration for another optical film 500 having multiple layers. The optical film 500 can have a substrate 502 as previously described and a first layer 504. The first layer 504 can comprise a first mixture 506 of a first optically clear resin 508 and a first plurality of magnetizable particles 510. The first layer 504 can be coupled to the substrate 502 either directly or indirectly. The relative size and spacing of the first plurality of magnetizable particles 510 has been exaggerated for illustration purposes and viewer understanding in FIG. 9. As shown in FIG. 9, the first plurality of magnetizable particles 510 have a first desired structure 511.

In FIG. 9, a second layer 512 can be coupled either directly or indirectly (via a second substrate for example) to the first layer 504. The second layer 512 can comprise a second mixture 514 of a second optically clear resin 516 and a second plurality of magnetizable particles 518. The relative size and spacing of the second plurality of magnetizable particles 518 has been exaggerated for illustration purposes and viewer understanding in FIG. 9. As shown in FIG. 9, the second plurality of magnetizable particles 518 have a second desired structure 519. The second desired structure 519 can differ from or be substantially similar to the first desired structure 511.

For example, the first desired structure 511 can be a first set of louver structures containing groups of magnetizable particles spaced at a first spacing distance from one another and at a first tilt angle and are aligned to the X-axis. The second desired structure 519 can be a second set of louver structures containing groups of magnetizable particles spaced at a second spacing distance from one another and at a second tilt angle and are aligned to the Y-axis. In alternative aspects, the first and second spacing distances can be the same or different. For example, spacing distances between groupings within the same desired structure may be about 5 mm or less, or about 4 mm or less, or about 3 mm or less, or about 2 mm or less, or about 1 mm or less, or about 0.5 mm or less, or about 0.25 mm or less, or about 0.1 mm or less, or about 0.05 mm. These spacing distances include all variations and ranges of specified distances, for example, spacing distances between groupings within the same desired structure may be from about 5 mm to about 1 mm, or from about 4 mm to about 0.25 mm, or from at least about 3 mm, etc.

In further alternative aspects, the first and second tilt angles can be the same or different. In even further alternative aspects, the first and second sets of louver structures can be aligned to the same or different axes.

As shown in FIG. 9, the first plurality of magnetizable particles 510 can have at least one of a shared first orientation or first common alignment direction relative to the substrate 502 and the second plurality of particles 518 can have at least one of a shared second orientation or second common alignment direction relative to the substrate 502. In FIG. 9, the shared first orientation or first common alignment direction differs from the shared second orientation or second common alignment direction.

Optionally, further layers can be added to the optical film 500 including layers having magnetizable particles with further desired structures. The embodiment of FIG. 9 shows a further layer 520 that can be configured to provide a smooth surface to the optical film 500 along an opposing side of the optical film from the substrate 502. In other cases, the further layer 520 can provide a desired texturing or other physical attributes if desired.

Other methods of forming a light control film with one or more layers for the control of light are described in U.S. Provisional Patent Application No. 62/699,966, incorporated by reference herein in its entirety.

EXPERIMENTS & EXAMPLES

The following embodiments and examples are intended as illustrations only, since numerous modification and variation within the scope of the present disclosure will be apparent to those skilled in the art. Unless otherwise noted, all parts, percentages, and ratios reported in the following examples are on a weight basis.

Preparation of the Light Control Films

Samples include magnetic particles dispersed in a binding matrix comprising mixtures of (meth)acrylate resins.

Many of the Example LCFs were prepared using the resin mixtures given in Table 1 below. The Photomer 6210 acrylate resin is available from IGM Resins USA, Inc., Charlotte, N.C., USA. Remaining acrylate resins listed in Table 1 are available from Sartomer Americas, Chatham, Va., USA. To each mixture A-G, 0.8% Darocur 4265 photoinitiator (source—BASF, Mobile, Ala., USA) was added. To mixture H, 0.5% TPO photoinitiator (source—IGM Resins) was added. Also shown in Table 1 are the measured viscosity values at 25° C. for some of the resin mixtures. Viscosity was measured using a Brookfield DV2T viscometer using the instructions supplied with the instrument.

TABLE 1

| Component | Sample ID/Weight Fraction | | | | | | | |
|---|---|---|---|---|---|---|---|---|
| | A | B | C | D | E | F | G | H |
| Sartomer SR-339 | 0.06 | 0.06 | 0.06 | 0.06 | 0.06 | 0.06 | 0.06 | 0.00 |
| Sartomer SR-454 | 0.10 | 0.10 | 0.10 | 0.10 | 0.10 | 0.10 | 0.10 | 0.00 |
| Sartomer SR-238 | 0.70 | 0.37 | 0.00 | 0.00 | 0.00 | 0.00 | 0.00 | 0.00 |
| Sartomer SR-602 | 0.14 | 0.47 | 0.84 | 0.84 | 0.84 | 0.84 | 0.84 | 0.00 |
| Sartomer SR-351 | 0.00 | 0.00 | 0.00 | 0.00 | 0.00 | 0.00 | 0.00 | 0.20 |
| Sartomer SR-238 | 0.00 | 0.00 | 0.00 | 0.00 | 0.00 | 0.00 | 0.00 | 0.20 |

TABLE 1-continued

| | Sample ID/Weight Fraction | | | | | | | |
|---|---|---|---|---|---|---|---|---|
| Component | A | B | C | D | E | F | G | H |
| Photomer 6210 | 0.00 | 0.00 | 0.00 | 0.00 | 0.00 | 0.00 | 0.00 | 0.60 |
| Viscosity (25 C.) cps | 81 | 299 | 518 | 715 | 912 | 1131 | 1349 | x |

Figure 10:
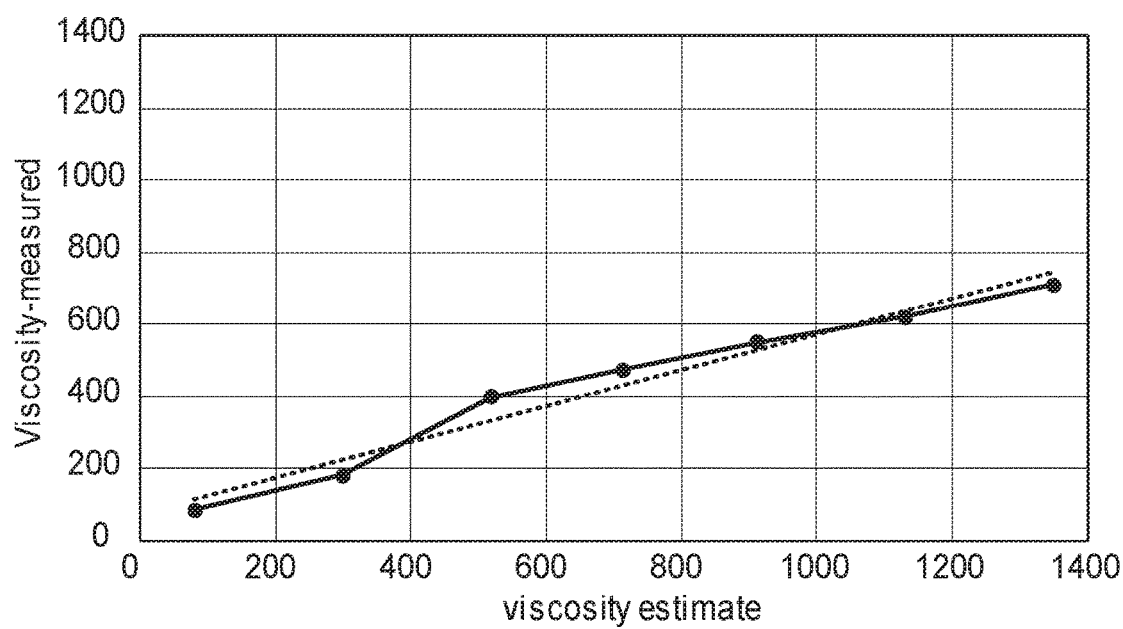
FIG. 10 is a plot showing measured viscosity values at 25° C. for sample resin mixtures.

FIG. 10 is a plot showing measured viscosity values at 25 C for sample resin mixtures in Table 1.

Exemplary Light Control Films

Example 1 represents an exemplary LCF with similar optical performance as Comparative Example 1. A 10% mixture of Permalloy (Permalloy Flake Powder; source—Novamet Specialty Product Corporation, Lebanon, Tenn.) was introduced into matrix resin H (see Table 1). The mixture was coated onto a suitable substrate. Magnetic alignment and cure were conducted in a manner consistent with the method described previously.

Example 2 represents an exemplary LCF with more restrictive optical performance than Example 1. A 20% mixture of Sendust (trade name SENDUST SP-3B; source—Mate Co., Ltd., Okayama Prefecture, Japan) was introduced into resin H (see Table 1). The mixture was coated onto a suitable substrate. Magnetic alignment and cure were conducted in a manner consistent with the method described previously.

Comparative Example 1 represents an LCF made using a micro-replication method of manufacture. A cylindrically-shaped metal roll with finely detailed channels cut into its outer surface served as the mold. A thermoplastic olefin copolymer (Tafmer DF9200, available from Mitsui Chemical America, Inc., Rye Brook, N.Y., USA) molten resin was introduced onto the mold and then pressed firmly against the metal roll in order to completely fill the mold. Upon cooling the structured film was removed from the mold. The resulting structure in the polymer film was a series of evenly spaced channels, each having a nominally trapezoidal cross-section, such as is described in WO 2018/229600, incorporated by reference herein in its entirety. A UV-curable resinous mixture similar to that described in WO 2018/229600 was filled into the grooves between transparent channels of the microstructured film prepared by the method described above. Excess pigment-containing resin was wiped from the outward-facing surface of the transparent channel. The pigment filled channels were then cured using UV radiation, resulting in an LCF.

Example 3 represents an exemplary LCF of varied thickness. A 7% mixture of SSFL (Stainless Steel Flake Fine Leafing Grade; source—Novamet Specialty Product Corporation, Lebanon, Tenn.) was introduced into matrix resin B of Table 1. Two microscope slides were aligned in a wedge-like fashion. Four pieces of tape were used at one edge of the slide to create a wedge gap. The SSFL flakes have 95% less than mesh 325 (approx. 44 μm) and thickness of 0.8 μm.

Magnetic alignment and cure were conducted in a manner consistent with the method described previously.

Examples 4, 5, 6, 7, and 8 represent exemplary LCFs of varied magnetically alignable particle concentration. A 2% (Ex. 4), 4% (Ex. 5), 8% (Ex. 6), 10% (Ex. 7), and 16% (Ex. 8) mixture of SSFL valor coated with approximately 40 nm of copper (Cu SSFL) was introduced into matrix resin B for Examples 4-8. Samples were coated to similar thickness. Magnetic alignment and cure were conducted in a matter consistent with the method described previously.

Example 9 represents an exemplary LCF at one matrix viscosity. A 7% Cu SSFL was introduced into matrix resin A and a magnetically alignable LCF was made according to the present method previously described.

Example 10 differs from Example 9 only in the matrix resin. A 7% Cu SSFL was introduced into matrix resin B and a magnetically alignable LCF was made according to the present method previously described.

Example 11 differs from Example 9 only in the matrix resin. A 7% Cu SSFL was introduced into matrix resin F and a magnetically alignable LCF was made according to the present method previously described.

Example 12 differs from Example 9 only in the matrix resin. A 7% Cu SSFL was introduced into matrix resin G and a magnetically alignable LCF was made according to the present method previously described.

Examples 13-15 represent LCFs at three different thicknesses. A 7% Cu SSFL was introduced into matrix resin B and a magnetically alignable LCF was made according to the present method previously described. Thickness of each LCF was controlled by the number of pieces of tape introduced as shim material between the glass microscope slides. Either two pieces (Example 13), four pieces (Example 14), or six pieces (Example 15) of tape were introduced at each side.

Examples 16 and 17 represent LCFs at two different louver tilt angles. A 5% Sendust was introduced into matrix resin H and a magnetically alignable LCF was made according to the present method previously described. However, the magnetic field was tilted relative to the plane of the film (non-normal placement relative to the plane of the LCF). The magnetic field tilt angle for Example 16 was less than that for Example 17.

Example 18 represents LCF at a louver tilt angle. 2% Sendust was introduced into matrix resin H and a magnetically alignable LCF was made according to the present method previously described. However, the magnetic field was tilted approximately 20° relative to the plane of the film (non-normal placement relative to the plane of the LCF).

Figure 11:
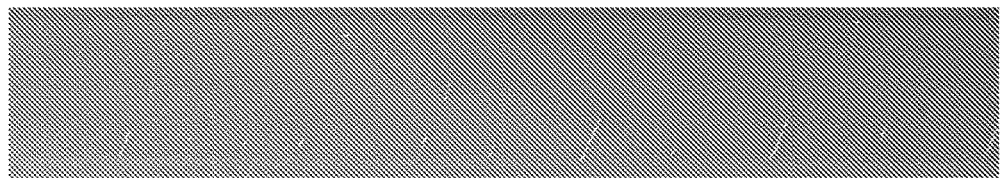
FIG. 11 is an image of a cross-sectional view of a sample LCF having angled light guiding structures prepared in accordance with an embodiment of the present invention.

FIG. 11 shows a cross-section photograph of a sample light control film having angled magnetizable particles corresponding to Example 18. As described above, it was discovered by the investigators that linear structures are not limited to be aligned in a fully upright manner. By tilting a sample and/or magnetic field at a particular angle, the linear features of the light blocking regions (the regions of magnetizable particles) can be aligned at any angle.

Optical Characterization of the Light Control Films

Figure 12:
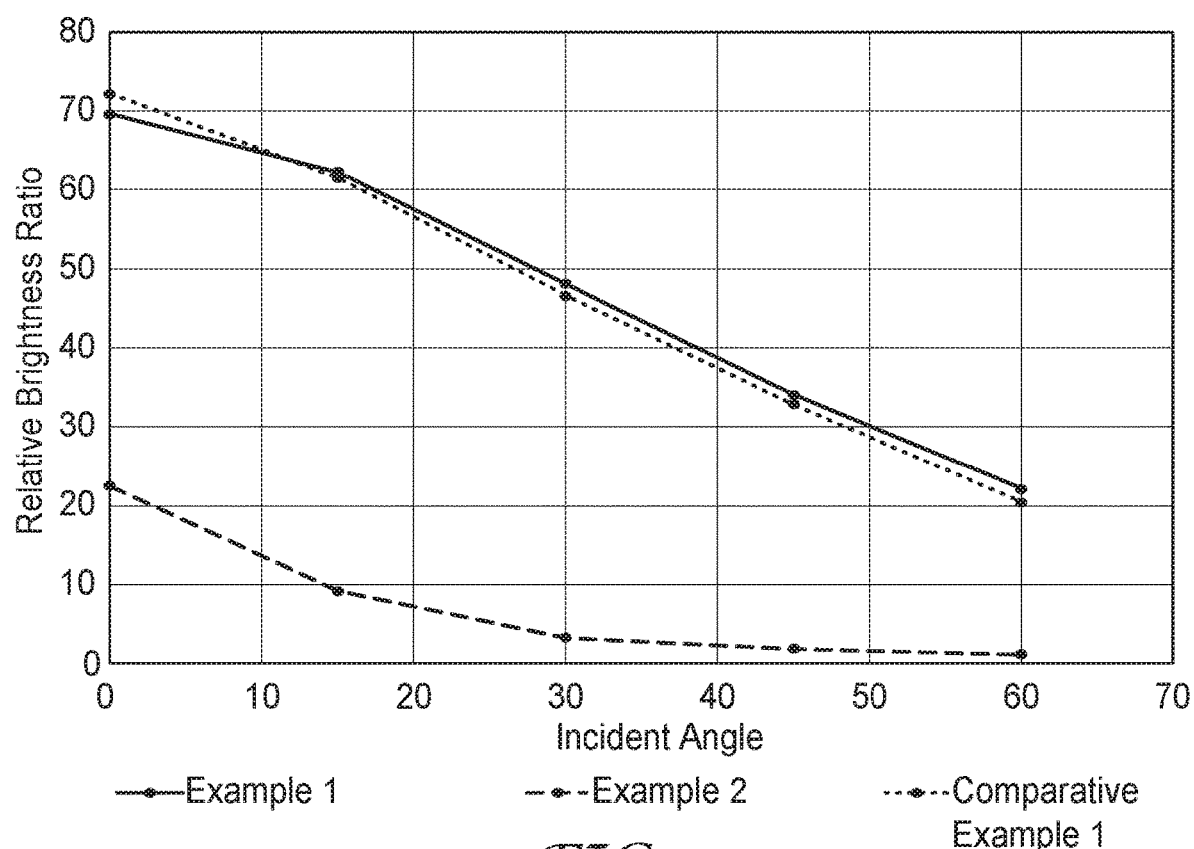
FIG. 12 is a plot showing the transmittance as a function of incidence angle of two LCF samples prepared in accordance with an embodiment of the present invention and a control LCF sample.

Angular transmission was measured on a spectrophotometer with a rotation stage (source—Oriel Instaspec Spectrograph, having a stage that allows a sample to be rotated out of plane for angular transmission measurements and illuminated with a lamp controlled by a Labsphere LPS-100 power supply). The stage was rotated from 0° to 60° in increments of 15°, measurements taken at each rotation of the stage. The visible transmittance averaged from 400 nm-700 nm was calculated from these measurements and plotted as a function of incident angle. FIG. 12 represents a plot of visible wavelength transmittance for Example 1, Example 2, and Comparative Example 1 LCFs. The visible wavelength transmittance is an arithmetic average of the transmittance over 400 nm-700 nm and is the RBR plotted in FIG. 12. Example 2 was intentionally designed to have a more restrictive viewing angle than Example 1 and Comparative Example 1. For the un-tilted louver structures, the RBR is a maximum at 0 deg angle of incidence as the internal ray path is parallel to the louver structures. The louver structure of Ex. 1 results in an RBR similar to the microstructured LCF of Comp. Ex. 1 at all angles.

Louver Spacing Control (Thickness)

Figure 13:
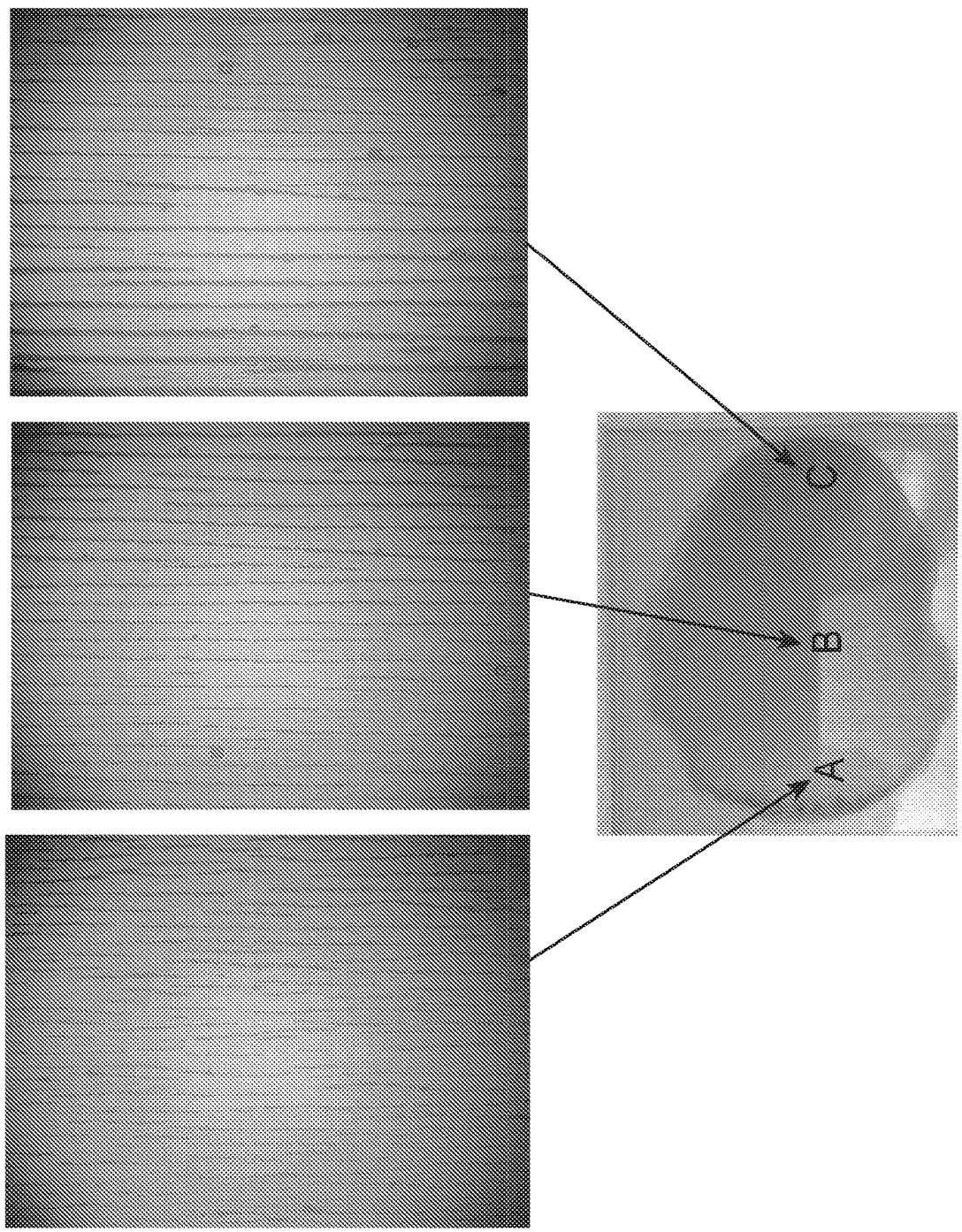
FIG. 13 shows microscope images at each thickness location across a sample LCF.

A Keyence VHX-2000 microscope with a VH Z1000UR lens was used to image the louver spacing of Example 3 LCF at three different positions across the microscope slide. FIG. 13 shows the microscope images at each thickness location (A (61 µm), B (209 µm), C (343 µm)) across the LCF. The louver spacing is greater as layer thickness is increased. For a given particle concentration louver spacing may be controlled by varying the thickness of the LCF.

Louver Spacing Control (Concentration of Magnetically Alignable Particles)

Figure 14:
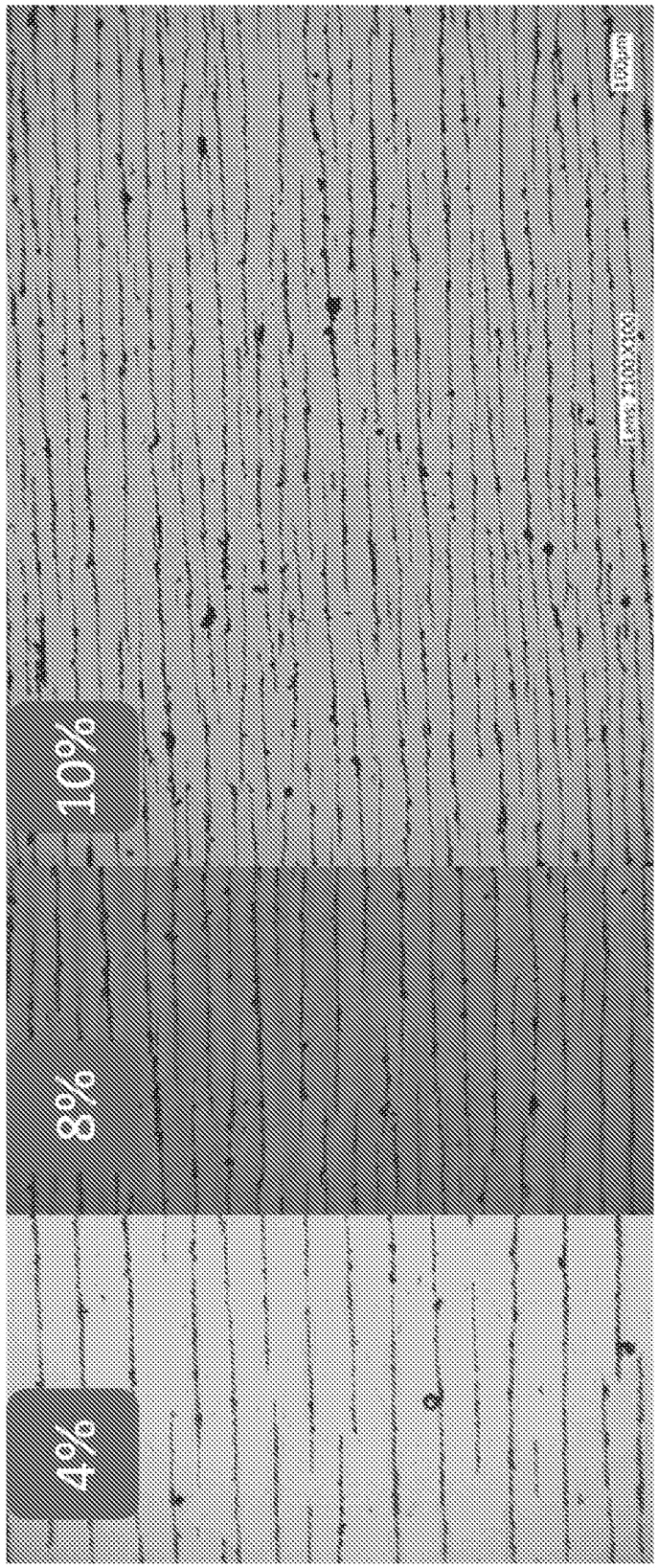
FIG. 14 shows microscope images of several sample LCFs.

A Keyence VHX-2000 microscope with a VH Z1000UR lens was used to image the louvers for Examples 4-8 LCFs. Shown in FIG. 14 are the images for Examples 5, 6, and 7. The microscope images were processed in custom image processing software. An average louver spacing was determined from these images by determining the discrete louvers (dark regions) in each column of the image and averaging the spacing for each column across the image.

Figure 15:
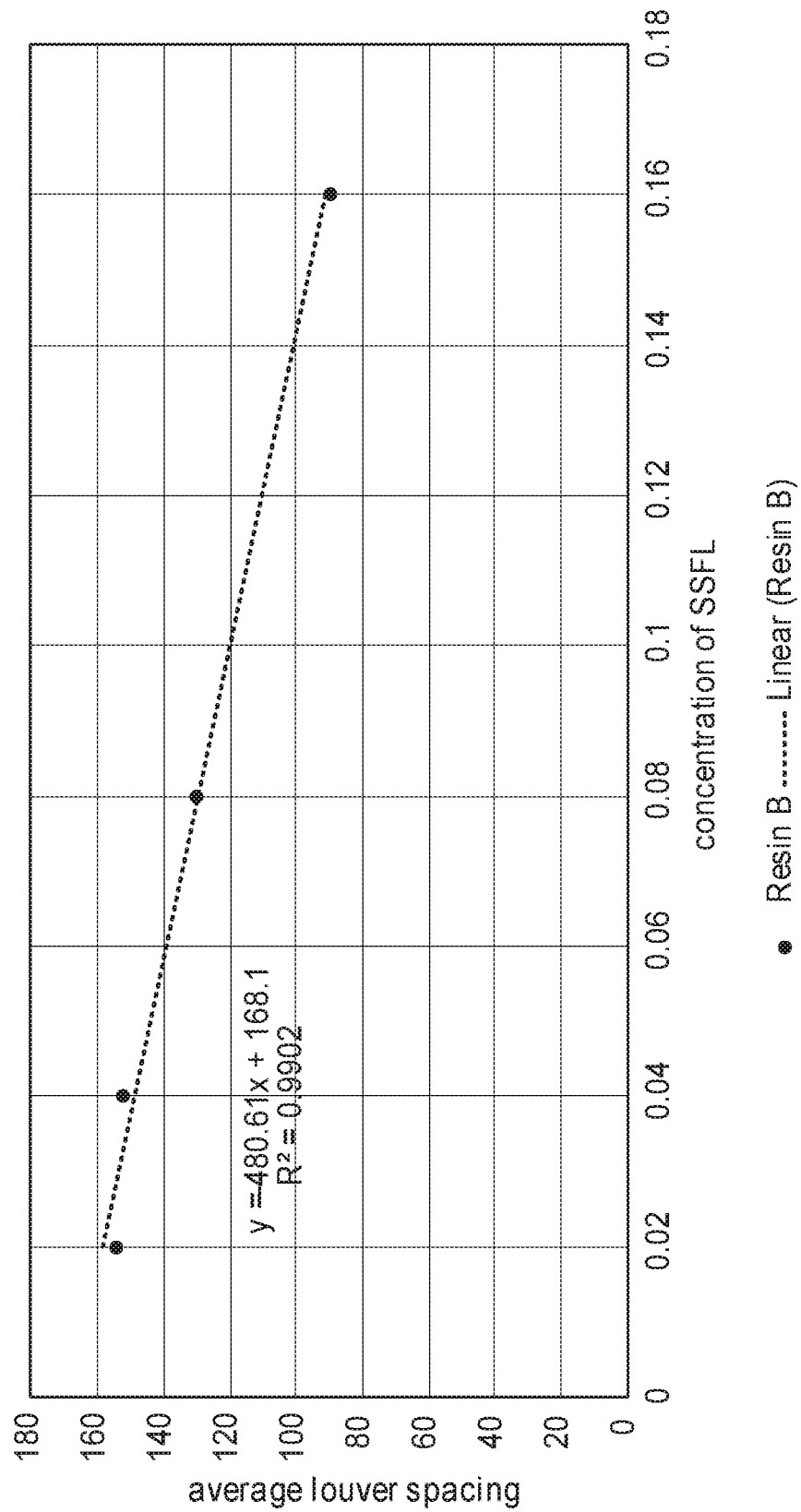
FIG. 15 is the average louver spacing vs. concentration of magnetically alignable particle in sample LCFs.

FIG. 15 represents a plot of the average louver spacing in micrometers vs. concentration of magnetically alignable particle in the LCF. Also represented is a linear regression of the experimental data. For a given resin system and thickness, then louver spacing may be controlled by the concentration of the magnetically alignable particles in the LCF.

Louver Orientation (Viscosity of Matrix Resin)

Figure 16:
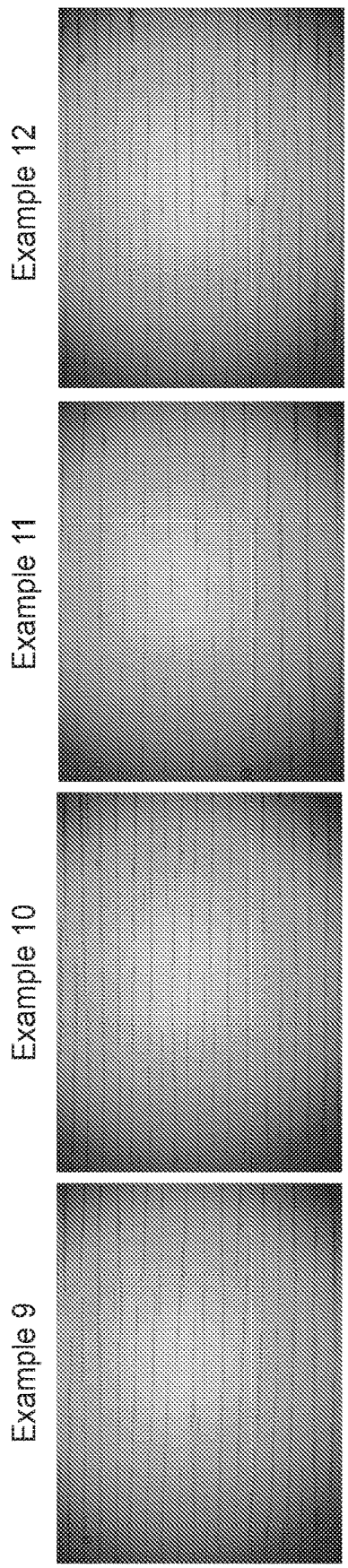
FIG. 16 shows microscope images of several sample LCFs.

A Keyence VHX-2000 microscope with a VH Z1000UR lens was used to image the louvers for Examples 9-12 LCFs. FIG. 16 shows the images for Examples 9-12 LCFs. Louvers are more continuous and appear better aligned at lesser matrix viscosities vs. greater matrix viscosities.

LCF Thickness

Figure 17A:
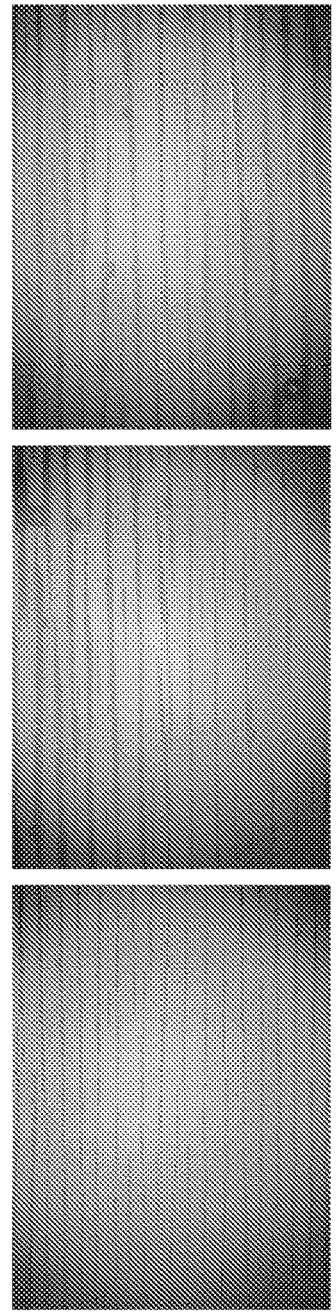
FIG. 17A shows microscope images of several sample LCFs.

A Keyence VHX-2000 microscope with a VH Z1000UR lens was used to image the louvers for Examples 13-15 LCFs. FIG. 17A shows the images for Examples 13-15 LCFs. Louvers are more continuous and appear better aligned at lesser thickness vs. greater thickness. Using the same computer program discussed for FIG. 15, the average louver structure length (i.e. the longest dimension of the louver structure, which would extend into the page of e.g., FIGS. 1, 2A, 2B, 3B, 3C) is 643 µm for Example 13, 239 µm for the Example 14 and 199 µm for Example 15.

Figure 17B:
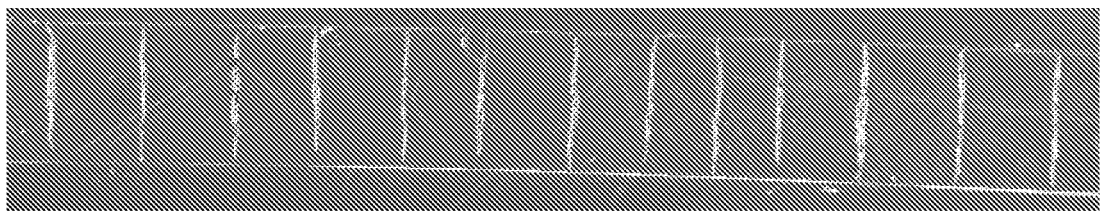
FIG. 17B shows cross-section images of several sample LCFs.
Figure 17B:
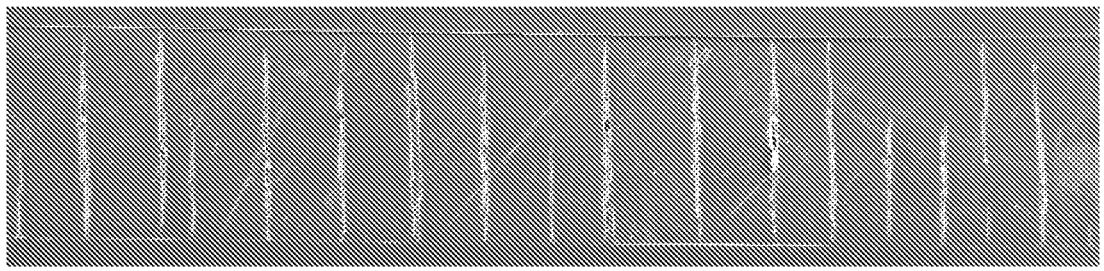
Figure 17B:
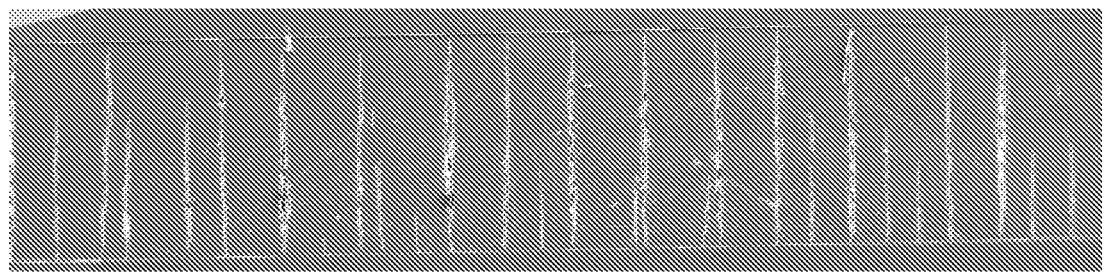

Cross-section images of each Example 13-15 are shown in FIG. 17B. The overall height of a louver may be controlled by the thickness of the LCF. The thickness of the film for 2-layers of tape shim, 4-layers and 6 layers is 239 µm, 507 µm and 770 µm, respectively. The louver structure generally spans the entire thickness of the sample. As such, these experiments confirm (by both the height and length of the louver structures) that each of the louver structures comprise a plurality of individual magnetizable particles.

Slanted Louvers

Figure 18:
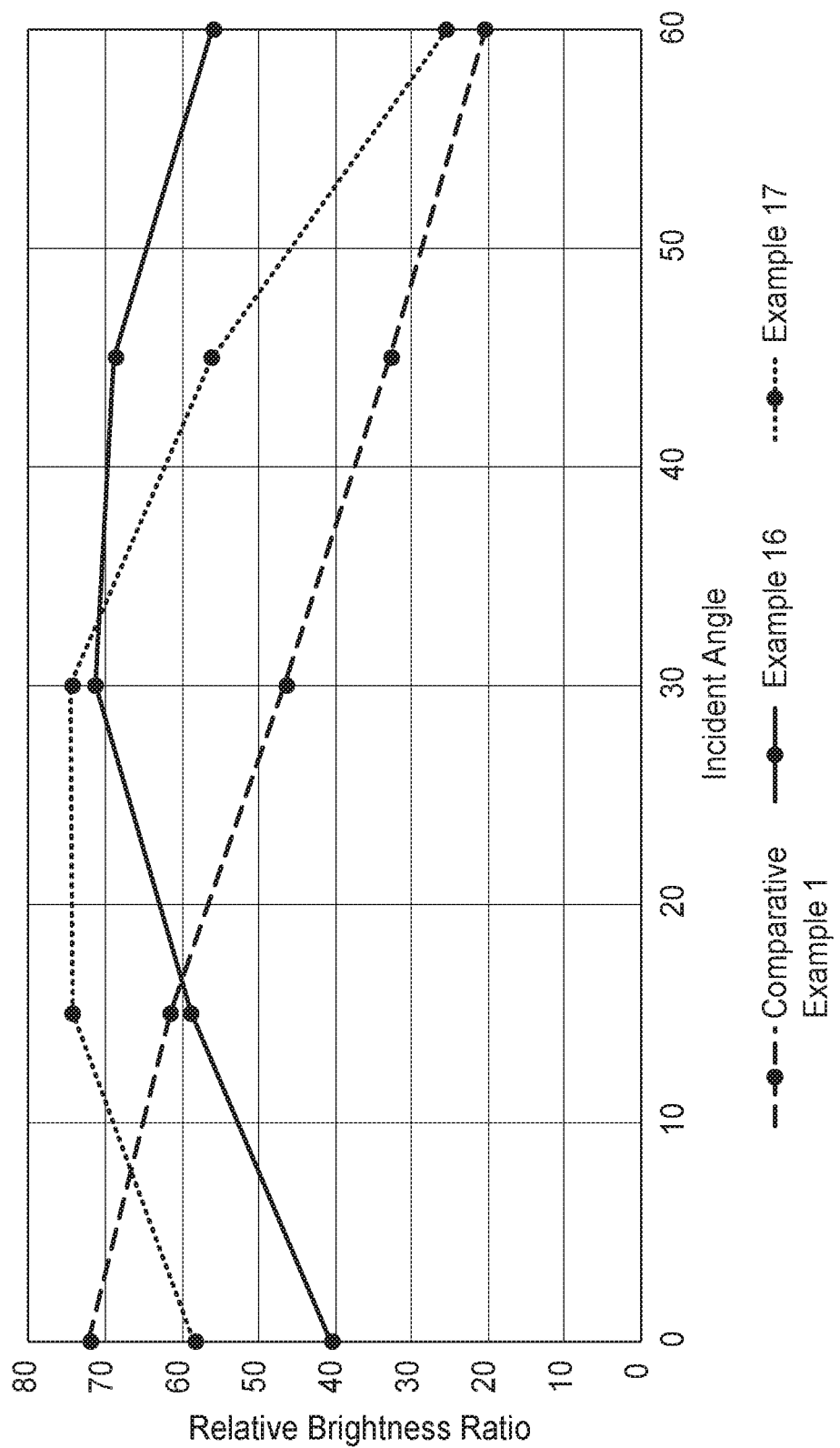
FIG. 18 shows an angular transmission plot of various sample LCFs.

Angular transmission was measured on a spectrophotometer with a rotation stage (source—Oriel Instaspec Spectrograph—see above). The stage was rotated from 0° to 60° in increments of 15°, measurements taken at each rotation of the stage. The visible transmittance averaged from 400 nm-700 nm was calculated from these measurements and is the RBR that is plotted as a function of incidence angle. FIG. 18 represents a plot of RBR for Examples 16-17 LCFs and Comparative Example 1.

The incidence angle of maximum RBR for Examples 16-17 occur at non-zero angles due to the tilted louver structures. In Example 16, the louver structure is tilted by approximately 22°. From Snell's Law, a light ray incident on the LCF at approximately 34° travels parallel to the louver structure inside the LCF. Hence the RBR is a maximum near 30° in FIG. 18.

In Example 17, the louver structure is tilted by approximately 15°. From Snell's Law, a light ray incident on the LCF at approximately 22° travels parallel to the louver structure inside the LCF. Hence the RBR is a maximum near 20° in FIG. 18.

Figure 19A:
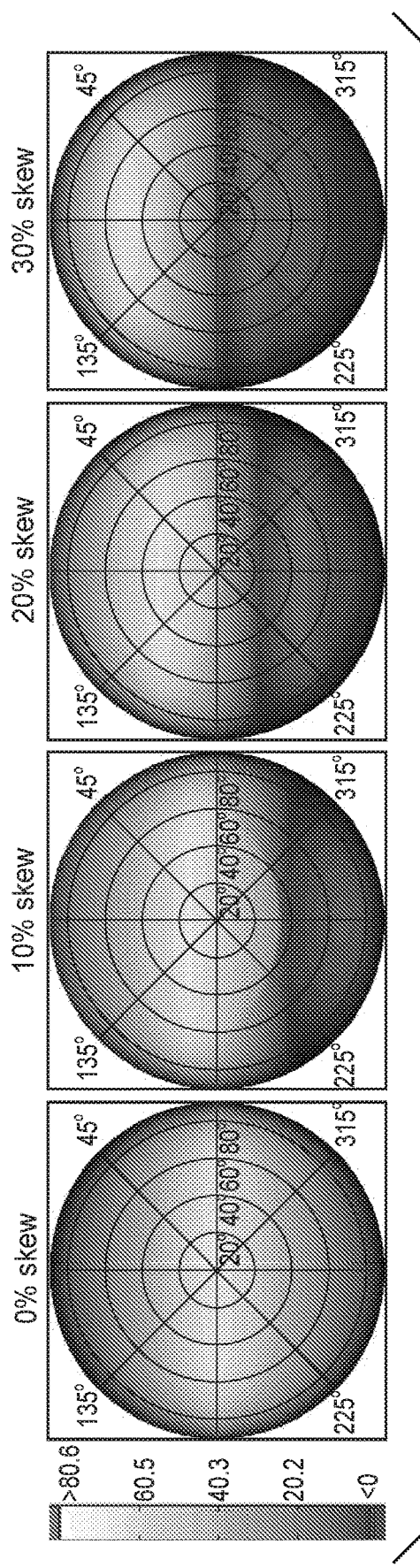
FIG. 19A is a set of conoscopic angular transmission plots for varying tilts of louver films.

Conoscopic angular transmission plots for model LCFs are shown in FIG. 19A.

A model of a louver film was created in a proprietary ray tracing program, although any commercially available ray tracing program could be used for simulations. The louver film comprised a planar film (n=1.5, thickness=86 units) with louvers spaced 55 units apart with each louver structure having a thickness of 7 units and a depth of 66 units. The louver lengths are orders of magnitudes larger than the space between such that they appear almost infinite. A dummy final collection surface is placed in proximity to the exit surface of the louver film. The louver film is surrounded by air.

Light rays are initiated from a line that spans a pair of louver structures plus the width of the louver structures. 1000 rays initiate from this line in the direction of the louver film. Since the louver widths are so much larger than the spacing, this cross section is representative. Light rays are traces from the line at all angles within a hemisphere directed at the louver film in 1° increments in both polar and azimuthal angles.

Light rays are allowed to split energy based on Fresnel coefficients for each angle, film index and air index. The split rays are tracked until their energy is less than 0.001% of the original ray. For each angle, the percentage of the original light ray that reaches the collection surface. The plots below in FIG. 19A depict this percentage. Polar angles are displayed as distance from the center of the plot with azimuthal angles arranged counterclockwise from the 3 o'clock position.

High transmission is shown in white in the scale on the left side of the figure. The center of each plot displays the transmission at 0° angle of incidence. Increasing the angle of incidence is depicted radially and the azimuthal angle rotates around the plot. As the physical tilt of the louvers increases, peak transmission shifts off axis.

Figure 19B:
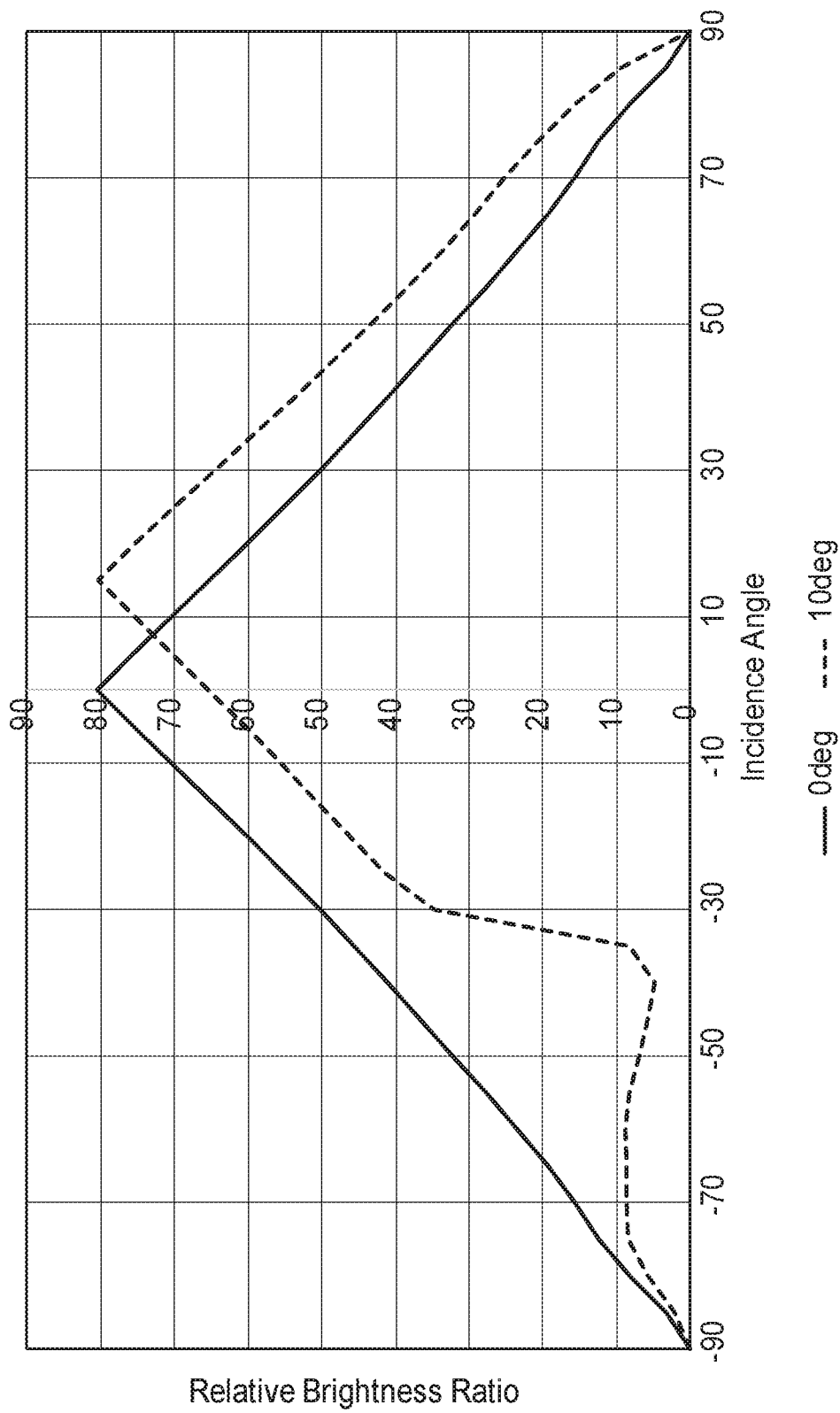
FIG. 19B is a set of cross sections of conoscopic angular transmission plots for varying tilts of louver films in the plane perpendicular to the louver structure length.

A set of cross sections of conoscopic angular transmission plots from FIG. 19A is shown in FIG. 19B for $\Theta_{louver}$=0 degrees and $\Theta_{louver}$=10 degrees. The cross sections are taken in the plane perpendicular to the length of the louver structures, shown in the 6 o'clock to 12 o'clock direction in FIG. 19A. The incidence angle of maximum RBR is 0° for $\Theta_{louver}$=0° and the incidence angle of maximum RBR is 16° for $\Theta_{louver}$=10°. These match with the predictions from Snell's law where the sine of maximum RBR angle can be related to the LCF index of refraction times $\Theta_{louver}$. EPVA values of the simulations can be calculated from the cross sections in FIG. 19B. The EPVA for $\Theta_{louver}$=0° is symmetric about 0° with a value of 150°. The EPVA for $\Theta_{louver}$=10° is not symmetric about 0° or the incidence angle of maximum RBR due to the tilted louver structure. The EPVA for $\Theta_{louver}$=10° is approximately 115°.

Figure 20A:
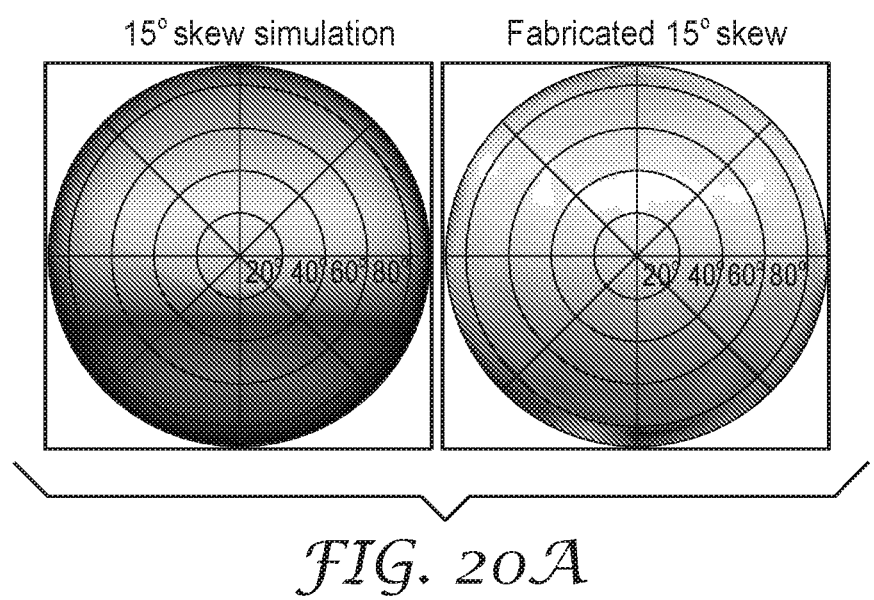
FIG. 20A shows a comparison of transmission for simulated 15° tilted louvers (left hand side) and fabricated film with 15° tilted particles.

A comparison of transmission for a simulated 15° tilted louvers (left hand side) and fabricated film (Example 16) with 15° tilted particles (right hand side) is shown in FIG. 20A. The measured conoscopic plot was obtained from short circuit current measurements of a single cell module using an NSP NS6ML-1940 solar mono cell with data collection captured with an Agilent 3497aA LXI Data Acquisition Switch Unit. The module was illuminated with a stabilized Oriel 66002 Xenon arc lamp. The module is mounted on a 2-axis rotation stage capable of 90° polar angle and 360° azimuthal angle rotation using custom software to control the stages and acquire short circuit current. Baseline measurements of the module angular response were made at 5° polar angle increments and 15° azimuthal angle increments. A louver film sample can be laminated to the module for angular measurements. The louver film effective transmission is obtained by dividing the sample measurement by the corresponding angular baseline measurement.

Figure 20B:
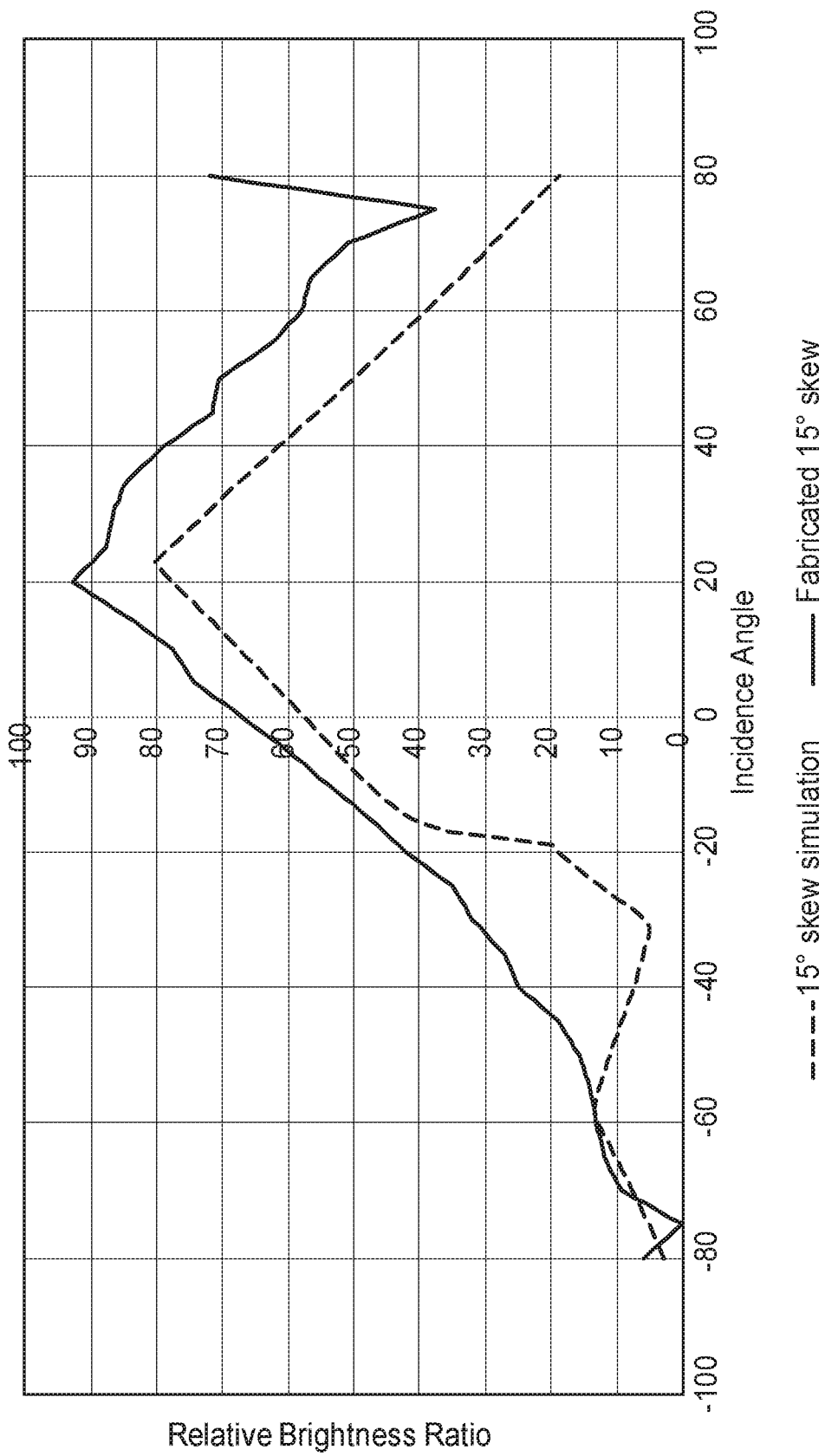
FIG. 20B shows a cross sections of the comparison of transmission for simulated 15° tilted louvers and fabricated film with 15° tilted particles.

The peak transmission for an exemplary LCF according to an embodiment of the present invention is shifted by approximately the same angle (20°) as the simulated LCF (23°) as shown in FIG. 20B. EPVA values for both the fabricated and simulated LCF are asymmetric about the incidence angle of maximum RBR. The data in FIG. 20A and FIG. 20B demonstrate the present invention can be used to fabricate a light control film with an asymmetric RBR profile (asymmetry about the incidence angle of maximum RBR) and asymmetric EPVA. This is difficult, if not impossible to achieve, with known manufacturing processes for LCF, such as is described in WO 2018/078493 and WO 2018/229600.

Differences between the model and sample could arise from the particle distribution, packing of the particles, absorption characteristics, scattering characteristics, irregularity of the particle alignment and/or other factors.

Figure 21:
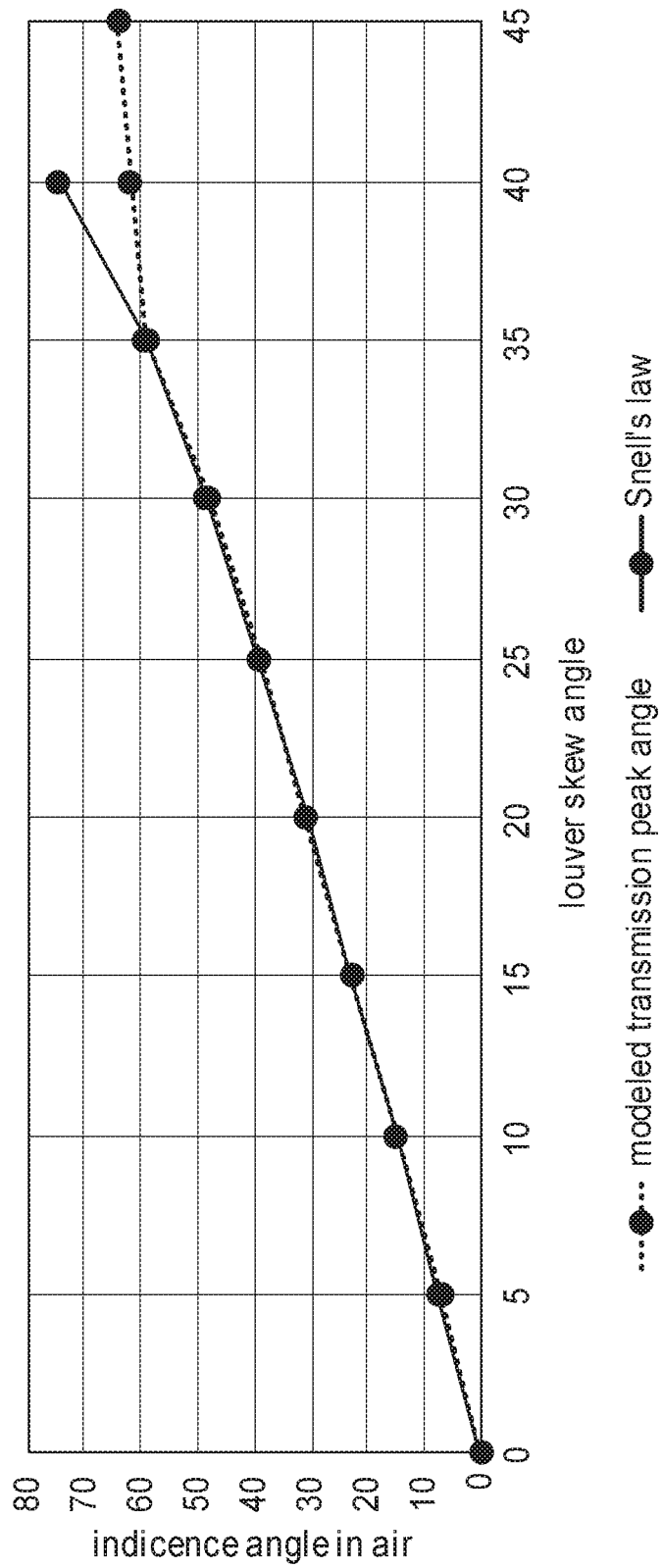
FIG. 21 is a plot showing a comparison between a modeled transmission peak angle and Snell's law.

In another experiment, as shown in FIG. 21, a simple ray trace model was constructed to predict the angular transmission profile. In the simulation, louver films were created with different tilts with respect to the film surface. The transmittance peak predictably follow Snell's law such that a physical louver tilt of 20° results in a peak transmittance at 30.9° for light incident in air and film with an index of 1.5 ($\sin \Theta_{peak} = n_{film} * \sin \Theta_{louver}$). As the louver film tilt approaches the critical angle of the film index, transmittance will suffer as the reflectivity of light increases rapidly. The resulting transmission peak location diverges from the location predicted from Snell's Law.

The invention claimed is:

1. A light control film having a series of louver structures, wherein each louver structure includes a one or more groupings of a plurality magnetizable particles aligned at least in a first orientation dispersed in a binding matrix comprising an optically cured material, the optically cured material having a viscosity of less than about 1350 cps at 25 degrees Celsius prior to curing,
   wherein the light control film substantially transmits light incident at a first angle and substantially limits transmission of light incident at a second angle,
   wherein each louver structure is spaced apart from an adjacent louver structure by from about 0.05 mm to about 5 mm, wherein each louver structure is aligned in a plane substantially parallel to an adjacent louver structure, and
   wherein each louver structure is oriented at a louver angle from about 0° to about 50° from a normal to a light incident surface of the light control structure.

2. The light control film according to claim 1, wherein light incident on a light input surface exits a light output surface having a maximum relative brightness ratio (RBR) in the major viewing axis direction of 50% or greater and an effective polar viewing angle (EPVA) of 150° or less.

3. The light control film according to claim 2, wherein light incident on the light input surface exits the light output surface having a maximum relative brightness ratio (RBR) in the major viewing axis direction of 60% or greater.

4. The light control film according to claim 1, wherein the incidence angle of maximum relative brightness ratio (RBR) is 80° or less.

\* \* \* \* \*